(12) United States Patent
Charles

(10) Patent No.: US 11,374,147 B2
(45) Date of Patent: Jun. 28, 2022

(54) PROCESS FOR MANUFACTURING AN OPTOELECTRONIC DEVICE HAVING A DIODE MATRIX

(71) Applicant: COMMISSARIAT À L'ÉNERGIE ATOMIQUE ET AUX ÉNERGIES ALTERNATIVES, Paris (FR)

(72) Inventor: Matthew Charles, Grenoble (FR)

(73) Assignee: COMMISSARIAT À L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 85 days.

(21) Appl. No.: 17/044,787

(22) PCT Filed: Apr. 17, 2019

(86) PCT No.: PCT/FR2019/050913
§ 371 (c)(1),
(2) Date: Oct. 1, 2020

(87) PCT Pub. No.: WO2019/202258
PCT Pub. Date: Oct. 24, 2019

(65) Prior Publication Data
US 2021/0119075 A1    Apr. 22, 2021

(30) Foreign Application Priority Data
Apr. 20, 2018 (FR) .................... 1853495

(51) Int. Cl.
*H01L 33/00* (2010.01)
*H01L 33/22* (2010.01)
(Continued)

(52) U.S. Cl.
CPC ...... *H01L 33/0093* (2020.05); *H01L 21/0254* (2013.01); *H01L 21/02381* (2013.01);
(Continued)

(58) Field of Classification Search
CPC ............. H01L 33/0093; H01L 33/12; H01L 21/02639; H01L 33/007; H01L 21/02647;
(Continued)

(56) References Cited

U.S. PATENT DOCUMENTS

| 6,342,404 B1 | 1/2002 | Shibata et al. |
| 2002/0079498 A1 | 6/2002 | Koide |

(Continued)

FOREIGN PATENT DOCUMENTS

| EP | 1667228 A2 | 6/2006 |
| EP | 2960940 A1 | 12/2015 |

OTHER PUBLICATIONS

International Search Report for International Application No. PCT/FR2019/050913, dated Nov. 29, 2019, 8 pages (with English translation).

(Continued)

*Primary Examiner* — Savitri Mulpuri
(74) *Attorney, Agent, or Firm* — Oblon, McClelland, Maier & Neustadt, L.L.P.

(57) ABSTRACT

A process for manufacturing an optoelectronic device having a diode matrix with semiconductor stacks involves providing a growth substrate having a support substrate coated with a nucleation layer defining a nucleation surface. A dielectric layer is deposited on the nucleation surface. A plurality of through-holes, extending to the nucleation surface, are formed in the dielectric layer. The nucleation layer, located in the through-holes, is etched to free up an upper surface of the support surface and expose a lateral surface of the nucleation layer forming a lateral nucleation surface. A dielectric region is formed extending in the support substrate such that, during a subsequent epitaxial growth stage, each first doped portion is formed especially from the lateral nucleation surface. In the through-holes and from the nucle- (Continued)

ation surface, the semiconductor stacks are epitaxially grown such that at least the first doped portions and active zones thereof are located in the through-holes.

14 Claims, 12 Drawing Sheets

(51) Int. Cl.
| | |
|---|---|
| *H01L 33/14* | (2010.01) |
| *H01L 33/20* | (2010.01) |
| *H01L 21/02* | (2006.01) |
| *H01L 33/12* | (2010.01) |
| *H01L 27/15* | (2006.01) |
| *H01L 27/144* | (2006.01) |

(52) U.S. Cl.
CPC .. *H01L 21/02639* (2013.01); *H01L 21/02647* (2013.01); *H01L 27/1446* (2013.01); *H01L 27/153* (2013.01); *H01L 33/007* (2013.01); *H01L 33/12* (2013.01); *H01L 33/14* (2013.01); *H01L 33/20* (2013.01); *H01L 33/22* (2013.01)

(58) Field of Classification Search
CPC ... H01L 27/1446; H01L 33/14; H01L 27/153; H01L 33/22; H01L 25/167; H01L 21/0254; H01L 2933/0016; H01L 21/02458; H01L 33/20; H01L 21/02381
IPC .................................................. H01L 33/0093
See application file for complete search history.

(56) References Cited

U.S. PATENT DOCUMENTS

| | | | |
|---|---|---|---|
| 2008/0093622 A1* | 4/2008 | Li | ............................ H01L 33/20 257/E33.001 |
| 2011/0121330 A1* | 5/2011 | Tak | .................... H01L 21/02439 438/47 |
| 2013/0221368 A1 | 8/2013 | Oraw | |
| 2014/0246647 A1 | 9/2014 | Cha et al. | |
| 2015/0137072 A1 | 5/2015 | Lee et al. | |
| 2017/0352532 A1 | 12/2017 | Dasgupta et al. | |

OTHER PUBLICATIONS

International Written Opinion for International Application No. PCT/FR2019/050913, dated Nov. 29, 2019, 26 pages (with English machine translation).

* cited by examiner

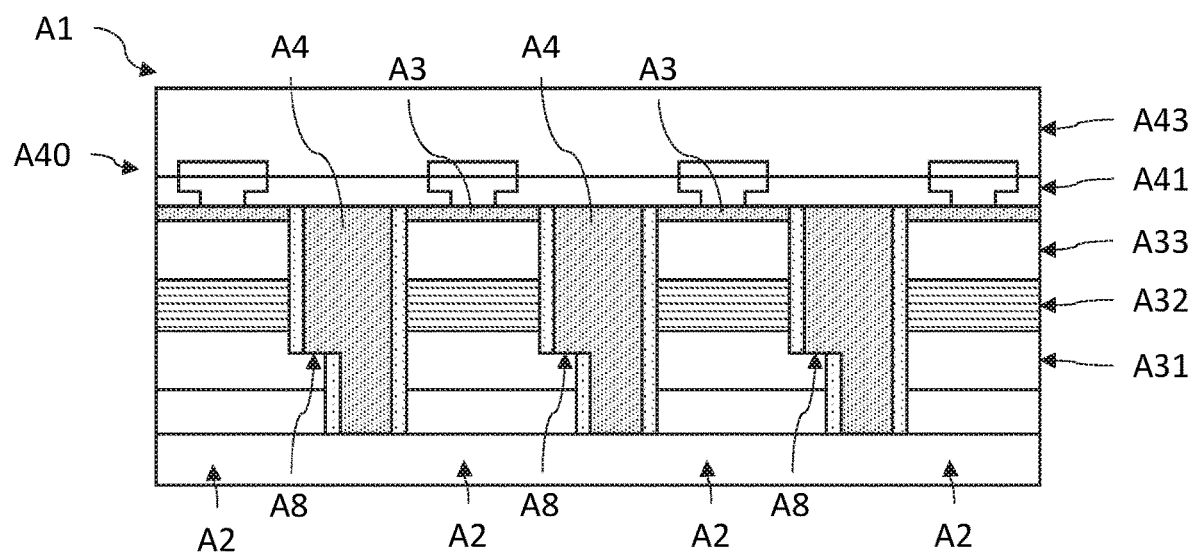
Fig.1
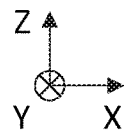

PROCESS FOR MANUFACTURING AN OPTOELECTRONIC DEVICE HAVING A DIODE MATRIX

CROSS-REFERENCE TO RELATED APPLICATIONS

This application is a national phase entry under 35 U.S.C. § 371 of International Patent Application PCT/FR2019/050913, filed Apr. 17, 2019, designating the United States of America and published as International Patent Publication WO 2019/202258 A2 on Oct. 24, 2019, which claims the benefit under Article 8 of the Patent Cooperation Treaty to French Patent Application Serial No. 1853495, filed Apr. 20, 2018.

TECHNICAL FIELD

The field of the present disclosure is that of optoelectronic devices comprising a matrix-array of light-emitting diodes or photodiodes. The disclosure notably applies to the field of lighting devices, display screens and image projectors, and to the field of photodetectors and sensors.

BACKGROUND

Optoelectronic devices comprising a matrix-array of light-emitting diodes suitable for forming lighting devices, display screens or image projectors already exist.

Thus, document EP2960940 illustrates an example of an optoelectronic device comprising a matrix-array of light-emitting diodes. As schematically illustrated in FIG. 1, this optoelectronic device A1 comprises a plurality of light-emitting diodes A2 each comprising a semiconductor stack formed from an n-doped segment A31 and from a p-doped segment A33 that are separated from each other by an active region A32 in which the light radiation of the light-emitting diode A2 is mainly generated.

The light-emitting diodes A2 have a so-called "mesa structure," i.e., they are obtained from a stack of two-dimensional semiconductor layers intended to form the various doped segments A31, A33 and the active regions A32, localized etching being carried out so as to singulate the light-emitting diodes A2. In this example, each diode A2 has an L-shape, the flanks of which are coated with an insulating passivation layer, with the exception of a shelf A8 formed by the doped segment A31. Electrodes A3 rest on the doped segments A33 and electrodes A4 extend between the diodes A2 and make contact with the shelves A8 formed by the doped segments A31. Each display pixel then comprises a semiconductor stack formed from the doped segments A31, A33 and from the active region A32, as well as the electrodes A3 and A4. A control chip A40 is hybridized with the matrix-array of light-emitting diodes A2, and here comprises an electrical-connection layer A41 and an integrated-circuit layer A43.

However, the process for fabricating this optoelectronic device has the drawback of requiring a step of localized etching of the doped two-dimensional semiconductor layers and of the active layer, with the aim of pixelating the diodes. Now, this etching step may lead to the formation of defects, especially on the etched flanks, these defects being liable to degrade the performance of the diodes, insofar as incorrect or insufficient passivation of the flanks may result in leakage.

Moreover, the difference in lattice parameter between the growth substrate and the epitaxially grown semiconductor layers may cause crystal defects to form, notably threading dislocations that extend in the direction of growth, thus degrading the crystal quality of the semiconductor stack, and therefore degrading the performance of the diodes.

In addition, during the cooling after the epitaxial growth step, the difference in coefficient of thermal expansion between the growth substrate and the semiconductor stack, for example between the silicon of the substrate and the nitride-based semiconductor, may generate a high tensile mechanical stress in the semiconductor stack, this stress being liable to cause cracks to appear in the semiconductor stack, or to cause the wafer to bend greatly. In this regard, techniques for engineering mechanical strain may make provision to deliberately introduce an initial compressive strain into the semiconductor during growth, for example via insertion of AlN interlayers or of AlGaN gradients.

BRIEF SUMMARY

The objective of embodiments of the present disclosure is to at least partially remedy the drawbacks of the prior art, and more particularly to provide a process for fabricating an optoelectronic device comprising a matrix-array of diodes allowing the risk of degradation of the crystal quality of the compound semiconductor on which the diodes are based to be decreased.

To this end, the subject of embodiments of the present disclosure is a process for fabricating an optoelectronic device comprising a matrix-array of diodes, each diode comprising: a semiconductor stack formed from a first doped segment and from a second doped segment, between which segments is located an active region. Each semiconductor stack has a coefficient of thermal expansion $\alpha_{es}$. The process comprises the following steps:
i) providing a growth substrate having a coefficient of thermal expansion $\alpha_{sc}$ lower than $\alpha_{es}$ and having a nucleation surface;
ii) depositing, on the nucleation surface, a dielectric layer made of an electrically insulating material having a coefficient of thermal expansion $\alpha_{mc}$ lower than $\alpha_{es}$;
iii) forming, in the dielectric layer, a plurality of through-apertures opening onto the nucleation surface; and
iv) producing, by epitaxial growth, in the through-apertures and from the nucleation surface, the semiconductor stacks, so that at least the first doped segments and the active regions are located in the through-apertures.

In addition, the growth substrate comprises a carrier substrate coated with a nucleation layer that defines the nucleation surface. In step iii), the following are also performed:
the nucleation layer located in the through-apertures is etched so as to free an upper surface of the carrier substrate and to expose a lateral face of the nucleation layer forming a nucleation lateral face; then
a dielectric region extending through or over the carrier substrate, from the upper surface of the carrier substrate, is formed so that, in step iv), the first doped segments are especially formed from the nucleation lateral face.

Each through-aperture may open vertically onto the nucleation surface, which then forms a nucleation lateral face that is flush with the lateral border of the dielectric layer, this lateral border bounding transversely the through-aperture. As a variant, each through-aperture may open vertically and laterally onto the nucleation surface, which then comprises a portion that protrudes into the through-aperture.

The following are certain preferred but nonlimiting aspects of this fabricating process.

Each through-aperture may comprise a single nucleation surface, which extends over one portion of the outline of the through-aperture, and the nucleation lateral face of which extends, in a plane parallel to the plane of the carrier substrate, in a convex or continuously rectilinear manner.

Each through-aperture being bounded transversely by at least one lateral border of the dielectric layer, the nucleation lateral face may be flush with the lateral border. Thus, the nucleation surface does not protrude into the through-aperture.

Each through-aperture may comprise a protruding portion of the nucleation layer, the protruding portion extending into the through-aperture on the carrier substrate and not being coated by the dielectric layer. The protruding portion may make contact with the carrier substrate.

An upper face (opposite the carrier substrate) of the protruding portion may participate in forming the nucleation surface.

The fabricating process may comprise a step of depositing a thin dielectric layer in each through-aperture so as to cover an upper face of the protruding portion as well as an upper face (visible in the through-aperture) of the carrier substrate, so as thus to form the dielectric region while leaving free the nucleation lateral face.

The dielectric region may be formed by oxidation or nitridation of the silicon-based carrier substrate, or by deposition of a thin dielectric layer.

In the epitaxial growth step, empty spaces may be formed between the semiconductor stacks and the dielectric region. Also, step iv) of epitaxial growth may be followed by a step of removing the growth substrate and a portion of the semiconductor stacks containing the empty spaces, so as to obtain a continuous and substantially planar face.

The dielectric layer may have a thickness $e_{mc}$, and each semiconductor stack may have a thickness $e_{es}$ less than or equal to $e_{mc}$.

Moreover, the thickness $e_{es}$ may be less than $e_{mc}$. Step iv) may then be followed by a step of producing second electrodes resting on and in electrical contact with the second doped segments, this step comprising the following sub-steps:

depositing a conductive layer of a thickness at least equal to the difference between $e_{mc}$ and $e_{es}$, made of at least one electrically conductive material, so as to cover the semiconductor stacks and an upper face of the dielectric layer, and planarizing the conductive layer, with the upper face of the dielectric layer employed as an etch-stop, so as thus to form a plurality of second electrodes that make contact with the second doped segments and that are each surrounded by the dielectric layer, the upper face of the dielectric layer and an upper face of the second electrodes then forming a continuous and substantially planar upper surface of an optoelectronic structure.

Moreover, the thickness $e_{es}$ may be less than $e_{mc}$. In this case, step iv) may be followed by a step of planarizing the dielectric layer, with an upper face of the semiconductor stacks employed as etch-stop, an upper face of the dielectric layer and the upper face of the semiconductor stacks then forming a continuous and substantially planar upper surface of an optoelectronic structure.

The process may comprise a step of hybridizing the optoelectronic structure, via its upper surface, with a control chip suitable for applying a potential difference to the diodes.

The optoelectronic structure and the control chip may be hybridized by direct bonding.

Each second doped segment may comprise a first portion and an overdoped second portion, the first portion being located between the overdoped second portion and the active region, and the overdoped second portion having a doping level greater than that of the first portion.

The second doped segment may have a p-type conductivity type.

The growth substrate and the dielectric layer may be made based on silicon.

The semiconductor stacks may be made based on a III-N compound.

Following step iii), each through-aperture may extend from the nucleation surface along a director axis that is inclined with respect to an axis orthogonal to a main plane of the growth substrate.

Each active region may be spaced apart from the corresponding nucleation surface by a minimum height, the minimum height and the angle of inclination of the director axis being defined beforehand so that the active region is not located plumb with the corresponding nucleation surface.

Following step iii), each through-aperture may comprise a first cavity that opens onto the nucleation surface, and a second cavity that opens onto an upper face of the dielectric layer and that communicates with the first cavity, the dielectric layer comprising a portion extending over the growth substrate and partially bounding the second cavity, the second cavity being laterally offset with respect to the first cavity so that, following step iv), the active region is not located plumb with the nucleation surface.

BRIEF DESCRIPTION OF THE DRAWINGS

Other aspects, aims, advantages and features of the present disclosure will become more clearly apparent upon reading the following detailed description of preferred embodiments thereof, which description is given by way of non-limiting example and with reference to the appended drawings, in which:

FIG. 1, which has already been described, is a schematic and partial view, in cross section, of an optoelectronic device comprising a matrix-array of diodes, the device being obtained using a fabricating process according to one example of the prior art;

DETAILED DESCRIPTION

In the figures and in the remainder of the description, the same references have been used to designate identical or similar elements. In addition, the various elements are not shown to scale for the sake of clarity of the figures. Unless indicated otherwise, the terms "substantially," "about," and "on the order of" mean to within 10%. Moreover, the expression "comprising a" should be understood to mean "comprising at least one," unless indicated otherwise.

Embodiments of the present disclosure relate to a process for fabricating an optoelectronic device 1 comprising a matrix-array of diodes 2. These may be light-emitting diodes or photodiodes.

FIGS. 2A to 2G are schematic and partial views, in cross section, of an embodiment of the process for fabricating an optoelectronic device 1 comprising a matrix-array of diodes 2. In this example, the diodes 2 are light-emitting diodes and are made based on GaN from a growth substrate 10 made based on silicon.

An orthogonal direct coordinate system XYZ, in which the X- and Y-axes form a plane parallel to the main plane of the growth substrate 10, and in which the Z-axis is oriented orthogonally to the XY-plane, is defined here and will be referred to in the rest of the description. In the remainder of the description, the terms "vertical" and "vertically" are understood to relate to an orientation substantially parallel to the Z-axis. The terms "lateral" and "laterally" are understood to relate to an orientation that is substantially parallel or inclined with respect to the Z-axis. Moreover, the terms "lower" and "upper" are understood to relate to positions of increasing distance from the growth substrate 10 in the +Z-direction.

Figure 2A:
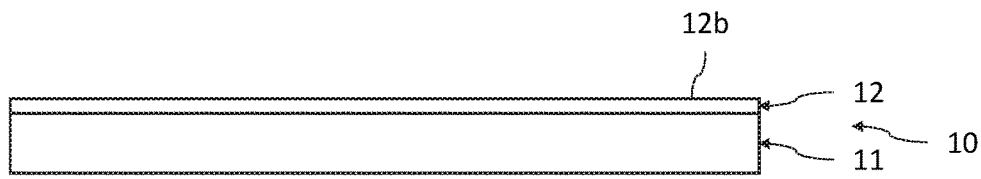
FIGS. 2A to 2G are schematic and partial views, in cross section, of various stages of a process for fabricating an optoelectronic device according to one embodiment comprising producing biasing electrodes before hybridization.

With reference to FIG. 2A, a growth substrate 10 suitable for allowing the epitaxial growth of semiconductor stacks of the diodes is provided. It has an upper face that defines a nucleation surface 12b. This growth substrate 10 may be a one-piece structure or be formed from a stack of layers, such as with an SOI substrate (SOI standing for silicon-on-insulator).

It may thus comprise a nucleation layer 12 resting on a carrier substrate 11. The upper face of the nucleation layer 12 opposite the carrier substrate 11 here defines the nucleation surface 12b. The nucleation layer 12 is made of a material that promotes the nucleation and the epitaxial growth of the semiconductor stacks, and may be an aluminum nitride or oxide (e.g., AlN or $Al_2O_3$), a magnesium nitride $Mg_xN_y$, or a nitride or a carbide of a transition metal, or any other suitable material. The thickness of the nucleation layer 12 may be on the order of a few nanometers to a few hundred nanometers. In this example, the nucleation layer 12 may be made of AlN. By "thickness," what is meant is the dimension of an element or of a layer along the Z-axis.

The carrier substrate 11 may be a one-piece or multilayer structure. It may be made of a group-IV semiconductor compound, for example of silicon, of germanium, or of silicon carbide, or of a III-V compound (such as AlN or GaN) or II-VI compound. It may also be made of a metal or of an insulating material such as sapphire. In this example, it is made based on silicon. By "based on silicon," what is meant is that the substrate is mainly made of silicon and that its average coefficient of thermal expansion is substantially equal to that of silicon. By "made mainly of a given material," what is meant is an element comprising the material in at least 50% of its volume.

The growth substrate 10 has a coefficient of thermal expansion $\alpha_{sc}$, which expresses the relative elongation $\Delta l/l$ of the growth substrate 10 in an XY-plane parallel to the plane of the growth substrate 10 for a temperature difference $\Delta T$. Generally, the coefficient of thermal expansion is defined as $\alpha=(l_2-l_1)/(l_1 \cdot (T_2-T))$, where $l_1$ and $l_2$ are the width of the element in question, i.e., its dimension in the XY-plane, at the temperature $T_1$ and $T_2$, respectively. In the case where the growth substrate 10 comprises a number of different materials, an average coefficient of thermal expansion is defined, which essentially corresponds to a weighting of the coefficients of thermal expansion of the various materials depending on their volume fraction. Here, the growth substrate 10 is formed from a number of different materials and its coefficient of thermal expansion is thus an average coefficient $\tilde{\alpha}_{sc}$ that may be defined by the relationship: $\alpha=\Sigma_i \alpha_i v_i$, where each material i has a coefficient of thermal expansion $\alpha_i$ and a volume fraction $v_i$.

The growth substrate 10 is such that its average coefficient of thermal expansion $\tilde{\alpha}_{sc}$ is lower than the coefficient of thermal expansion $\alpha_{es}$ of the semiconductor stacks 30. In this example, the semiconductor stacks 30 are made based on a semiconductor compound that is referred to as the "basic semiconductor compound, i.e., it is mainly formed of this semiconductor compound and its coefficient of thermal expansion $\alpha_{es}$ is substantially equal to the coefficient of thermal expansion of this semiconductor compound. Here, the semiconductor stacks 30 are made based on GaN, so that the coefficient $\alpha_{es}$ is substantially equal to that of GaN, i.e., about $5.6\times10^{-6}$ $K^{-1}$. The growth substrate 10 is made based on silicon, i.e., it mainly comprises silicon and its average coefficient of expansion $\tilde{\alpha}_{sc}$ is substantially equal to the coefficient of thermal expansion of silicon $\alpha_{si}$, which is equal to about $2.6\times10^{-6}$ $K^{-1}$.

Figure 2B:
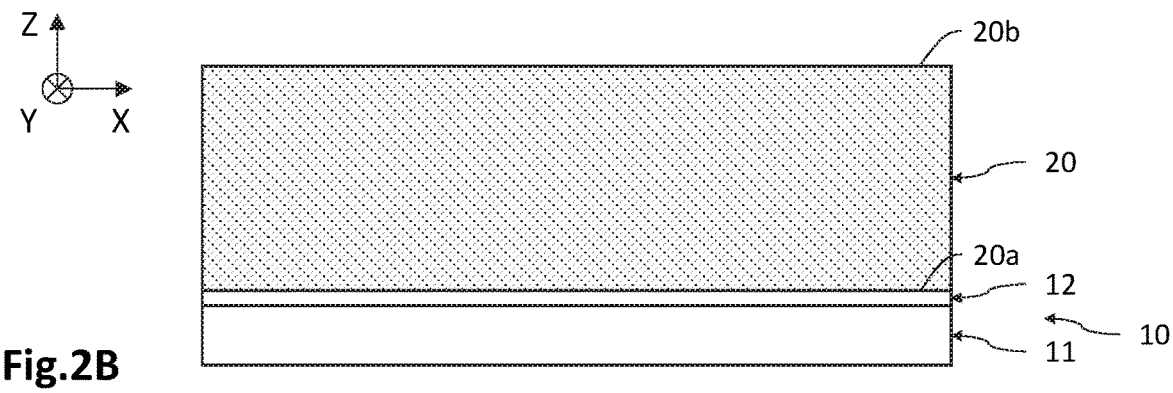

With reference to FIG. 2B, a dielectric layer 20 intended to form a growth mask is deposited on the growth substrate 10. The dielectric layer 20 then continuously covers the nucleation surface 12b.

The dielectric layer 20 is made of at least one electrically insulating material, for example a silicon oxide or nitride, such as $SiO_2$ or $Si_3N_4$, or even a silicon oxynitride, an aluminum oxide or a hafnium oxide. The material of the dielectric layer 20 is chosen so that its coefficient of thermal expansion $\alpha_{mc}$ is lower than the coefficient of thermal expansion $\alpha_{es}$ of the semiconductor stacks 30. In this example, the dielectric layer 20 is made of $SiO_2$, the coefficient of thermal expansion $\alpha_{mc}$ of which is equal to about $0.5\times10^{-6}K^{-1}$, which is much lower than the coefficient of thermal expansion of GaN.

The dielectric layer 20 has a thickness $e_{mc}$ that is preferably substantially uniform right across the layer. Here the thickness is the distance along the Z-axis between a first face 20a, called the lower face, which makes contact with the growth substrate 10, and an opposite second face 20b, called the upper face. The upper face 20b is thus substantially parallel to the upper face of the growth substrate 10. The thickness $e_{mc}$ of the dielectric layer 20 is advantageously chosen so as to be greater than or equal to the thickness $e_{es}$ of the semiconductor stacks 30 produced subsequently. The dielectric layer 20 may have a thickness $e_{mc}$ in a range between 100 nm and 50 µm, and preferably in a range between about 2 µm and 5 µm.

Figure 2C:
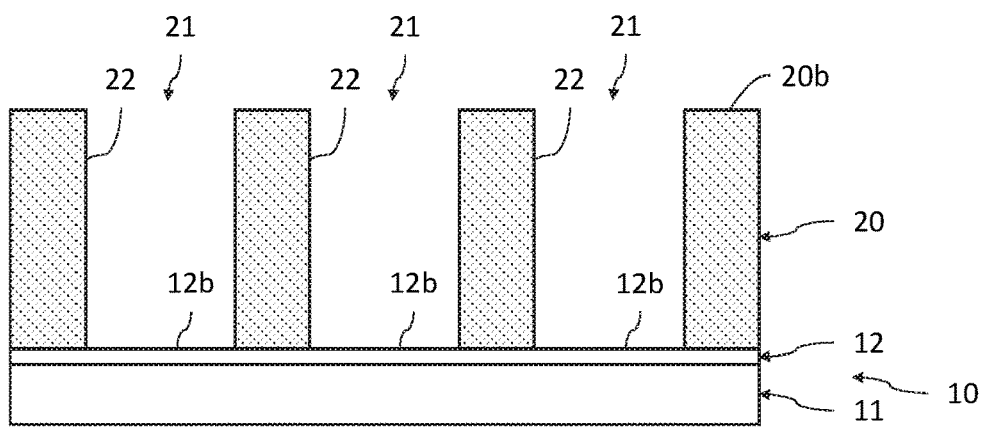

With reference to FIG. 2C, through-apertures 21 are then produced in the dielectric layer 20 using conventional photolithography and etching techniques and, for example, using a dry plasma (RIE, ICP, etc.) etching technique, so as to free portions of the nucleation surface 12b locally. The dielectric layer 20 then forms a growth mask. The through-apertures 21 are thus intended to receive the semiconductor stacks 30.

The cross section of the through-apertures 21 in the XY-plane may be of various shapes, for example a circular, oval or polygonal shape, for example a triangular, square, rectangular or even hexagonal shape. The diameter of a through-aperture 21 is here a quantity associated with the perimeter of a cross section thereof in the XY-plane. Preferably, this diameter is substantially constant along the Z-axis, but may also vary along the Z-axis. From one aperture to the next, the through-apertures 21 may have the same dimensions.

The through-apertures 21 may have lateral dimensions, in the XY-plane, comprised between 500 nm and a few millimeters, depending on the intended applications, and preferably comprised between 1 µm and 10 µm. The transverse dimension of the growth mask 20 separating two adjacent through-apertures 21 may be on the order of about 1 µm.

The lateral border 22 of the through-apertures 21 links the upper face 20b of the dielectric layer 20 to the nucleation surface 12b. In this example, the lateral border 22 extends in a continuously rectilinear and orthogonal manner between the nucleation surface 12b of the growth substrate 10 and the upper face 20b of the dielectric layer 20. As a variant, as described below, the through-apertures 21 may be inclined with respect to the Z-axis, i.e., they extend along a director axis that is inclined with respect to the Z-axis, from each nucleation surface 12b. As a variant, the through-apertures 21 may be structured so as to comprise a first cavity that opens onto a nucleation surface 12b, and a second cavity that communicates with the first cavity and that opens onto the upper face 20b.

Figure 2D:
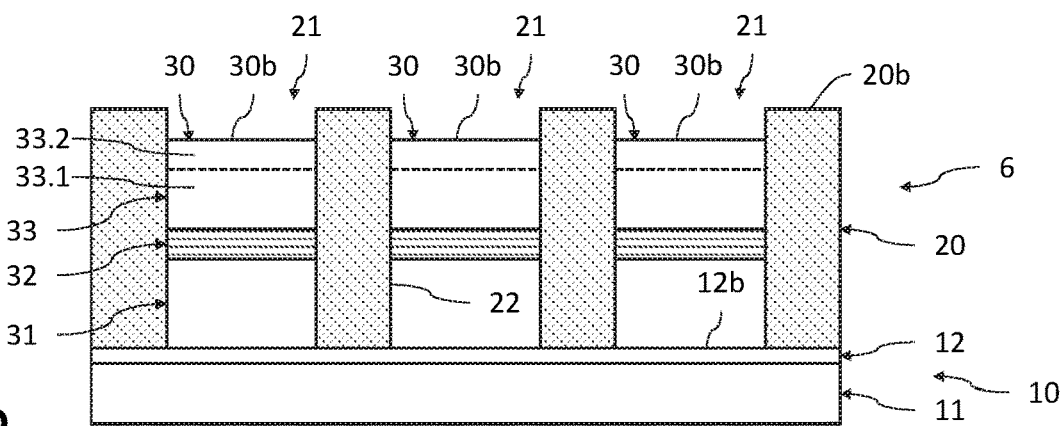

With reference to FIG. 2D, the semiconductor stacks 30 are then produced in the through-apertures 21, by epitaxial growth, from each nucleation surface 12b.

Each semiconductor stack 30 comprises a first segment 31 doped a first conductivity type, n-type for example, and a second segment 33 doped a second conductivity type opposite the first type, p-type for example, between which segments is located an active region 32. Of course, the conductivity types may be inverted. The semiconductor stacks 30 are preferably produced simultaneously, so that the doped segments 31, 33 and the active region 32 of each semiconductor stack 30 advantageously have substantially the same characteristics in terms of dimensions, composition and doping level.

The semiconductor stacks 30 are produced so that at least the n-doped first segments 31 and the active regions 32 are located in the through-apertures 21. Preferably, the p-doped second segments 33 are entirely located in the through-apertures 21, so that the semiconductor stacks 30 have a thickness $e_{es}$ less than or equal to the thickness $e_{mc}$ of the growth mask 20. The thickness $e_{es}$ is here the dimension along the Z-axis separating the lower face from the facing upper face 30b of the semiconductor stacks 30. The lower face is here the face of the n-doped first segments 31 making contact with the growth substrate 10, and the upper face 30b is here the face of the p-doped second segments 33 opposite the active region 32.

Each semiconductor stack 30 is mainly produced from the same basic semiconductor compound, for example a III-V compound comprising at least one element from column III of the periodic table and at least one element from column V, a II-VI compound comprising at least one element from column II of the periodic table and at least one element from column VI, or even a group-IV compound comprising at least one element from column IV. By way of example, the III-V compounds may be III-N compounds, such as GaN, InGaN, AlGaN, AlN, InN or AlInGaN, or even comprise an element from column V such as arsenic or phosphorus, as in the case of GaAs or InP, for example. Furthermore, the II-VI compounds may be CdTe, HgTe, CdHgTe, ZnO, ZnMgO, CdZnO or CdZnMgO. Finally, group-IV elements or compounds such as Si, C, Ge, SiC, SiGe, or GeC may be used. In this example, the semiconductor stacks 30 are made based on GaN.

The semiconductor stacks 30 may be produced using a process such as chemical vapor deposition (CVD), metal-organic chemical vapor deposition (MOCVD) for example, or a process such as molecular beam epitaxy (MBE) or hydride vapor phase epitaxy (HVPE). In this example, the semiconductor stacks 30 are produced by MOCVD. Thus, the growth is selective and the semiconductor stacks 30 are formed by epitaxy from the nucleation surface 12b, and not from the lateral borders 22.

The semiconductor stacks 30 have a thickness $e_{es}$ that is preferably less than or equal to the thickness $e_{mc}$ of the growth mask 20. This makes it possible, during a subsequent planarizing process, to avoid the need to remove a portion of the second doped segment 33 should the latter protrude out of the through-aperture 21. This is particularly advantageous when the second segment 33 is p-doped and is formed from a p-doped first portion 33.1 and of a p+ overdoped second portion 33.2, the first portion 33.1 being located between the active region 32 and the overdoped second portion 33.2. The risk of degradation of the ohmic contact between the anode 3 produced subsequently and the p-doped second segment 33 is thus limited.

The semiconductor stacks 30 have dimensions, in particular lateral dimensions, that are correlated with those of the through-apertures 21. They may thus have a thickness $e_{es}$ in a range between 100 nm and 50 µm, and preferably in a range between about 2 µm and 5 µm; the thickness of the n-doped first segments 31 may be in a range between 50 nm and 20 µm, and for example may be equal to about 2 µm; the thickness of the active region 32 may be in a range between 10 nm and 500 nm; and the thickness of the p-doped second segment 33 may be in a range between 50 nm and 2 µm, and for example be equal to about 200 nm. The lateral dimensions, in the XY-plane, may be in a range between 500 nm and a few millimeters, depending on the intended applications, and are preferably in a range between 1 µm and 10 µm.

Each first doped segment 31 may here be made of GaN doped n-type, for example with silicon. Each first doped segment is produced by epitaxy from the nucleation surface 12b and is bounded laterally by the lateral border 22 of the growth mask 20 with which it makes contact. As the growth is selective, there is no growth on the lateral borders 22.

The active region 32 is the portion of the diode 2 from or in which most of the light radiation is emitted or detected. It may comprise at least one quantum well made of a semiconductor compound having a bandgap narrower than those of the first and second doped segments 31, 33. It may comprise a single quantum well or a plurality of quantum wells taking the form of layers or dots placed between barrier layers. It may be intrinsic, i.e., unintentionally doped. It may here be formed from an alternation of GaN barrier layers and of InGaN quantum wells. The active region 32 covers the upper surface of the n-doped first segment 31 and is bounded laterally by the lateral border 22 of the growth mask 20 with which it makes contact.

The p-doped second segment 33 may be made of the basic semiconductor compound, i.e., here from GaN, or be a GaN alloy, InGaN for example. It is here doped with p-type, for example with magnesium. It covers the upper surface of the active region 32 and is here bounded laterally by the lateral border 22 of the growth mask 20 with which it makes contact, notably when the thickness $e_{mc}$ of the growth mask 20 is greater than the thickness $e_{es}$ of the semiconductor stack 30.

The p-doped second segment 33 may further comprise an intermediate electron-blocking layer (not shown) located at the interface with the active region 32. The electron-blocking layer may here be formed from an (advantageously p-doped) ternary III-N compound, for example from AlGaN or AlInN. It allows the radiative recombination rate in the active region 32 to be increased.

The p-doped second segment 33 advantageously comprises a first portion 33.1 p-doped to a first doping level and a p+ overdoped second portion 33.2, i.e., a region that is p-doped to a second doping level greater than the first doping level. The first portion 33.1 is located between the active region 32 and the p+ overdoped second portion 33.2. This p+ overdoped portion 33.2 allows the ohmic contact between the p-doped second segment 33 and the biasing electrode 3 to be improved.

Thus, a plurality of semiconductor stacks 30 are obtained, each located in a through-aperture 21 of the growth mask 20. The growth mask 20 is a thick dielectric layer that extends continuously between and in contact with the semiconductor stacks 30. It is said to be thick in the sense that at least the n-doped first segments 31 and the active regions 32, and preferably the p-doped second segments 33, are located in the through-apertures 21 and laterally make contact with the material of the growth mask 20.

In this example, the semiconductor stacks 30 have a thickness $e_{es}$ less than that $e_{mc}$ of the growth mask 20, so that recessed regions are formed at the surface of the semiconductor stacks 30 with respect to the upper face 20b of the growth mask 20. These recessed regions have a height along the Z-axis equal to the difference between the thickness $e_{mc}$ and the thickness $e_{es}$. In this example, the presence of the recessed regions is taken advantage of to subsequently produce biasing electrodes 3, here anodes, placed in electrical contact with the p-doped second segments 33.

In the context of the fabricating process according embodiments of the disclosure, the semiconductor stacks 30, which are separate from each other, are pixelated from the epitaxial growth thereof, because they are produced in the through-apertures 21 of the growth mask 20 and not by localized etching of a semiconductor stack formed from two-dimensional layers, as in the aforementioned example of the prior art. Thus, the risk of degradation of the crystal quality of the semiconductor compound, in particular on the lateral flanks of the semiconductor stacks, is reduced since the pixilation is not achieved by localized etching. The optical and/or electronic properties of the optoelectronic device 1 are thus improved.

In addition, the semiconductor stacks 30 are produced by epitaxial growth in the through-apertures 21 of the growth mask 20, the latter being a thick dielectric layer in contact at least with the n-doped first segments 31 and the active regions 32. Thus, the growth mask 20 performs an additional function passivating the lateral flanks of the semiconductor stacks 30, allowing the effect of any surface states, which could lead to non-radiative recombination in the active region 32, to be limited or vertical leaks to be limited. The internal quantum efficiency of the active region 32 is thus improved, this also allowing the optical and/or electronic properties of the optoelectronic device 1 to be improved.

Furthermore, the pixelated semiconductor stacks 30, in association with the growth mask 20, form an optoelectronic structure 6 that has an average coefficient of thermal expansion $\tilde{\alpha}_{so}$ the value of which is lower than the coefficient of thermal expansion $\alpha_{es}$ of the semiconductor stacks 30, the latter coefficient here being substantially equal to that of GaN. The average coefficient $\tilde{\alpha}_{so}$ is here substantially equal to the coefficient $\alpha_{es}$ of the semiconductor stacks 30 plus the coefficient $\alpha_{mc}$ of the growth mask 20 weighted by their respective volume fractions. Thus, the difference between the average coefficient of thermal expansion $\tilde{\alpha}_{so}$ of the optoelectronic structure 6 and the average coefficient of thermal expansion $\alpha_{sc}$ of the growth substrate 10 is decreased, thus decreasing the magnitude of the tensile mechanical stresses experienced by the semiconductor stacks 30 after the cooling phase following the process of epitaxial growth. These mechanical stresses are also decreased because the semiconductor stacks 30 are pixelated from growth, thus improving the distribution within the optoelectronic structure 6 of the mechanical stresses generated in the cooling phase. The risk of cracks appearing in the material of the semiconductor stacks 30 is thus limited. It is thus possible to decrease the complexity of any mechanical-strain engineering techniques employed to apply an initial compressive mechanical strain to the material of the semiconductor stacks 30 during the epitaxial growth, thus simplifying the fabricating process.

Figure 2E:
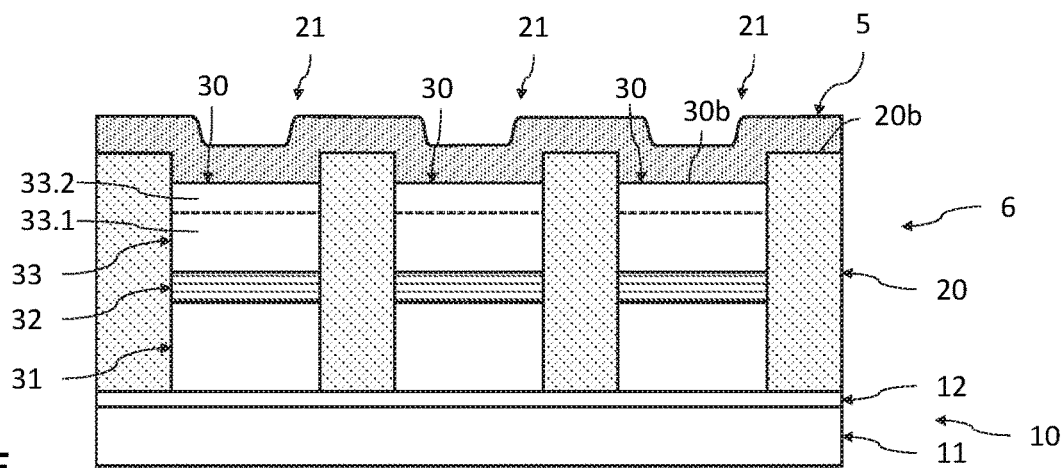

With reference to FIG. 2E, biasing electrodes intended to apply an electric potential to the p-doped second segments 33 are then produced. In this example, a wafer-level deposition of an electrically conductive material is carried out so as to continuously cover the growth mask 20 and the semiconductor stacks 30, and to fill the recessed regions above each semiconductor stack 30. The thickness of this conductive layer 5 is here greater than or equal to the difference between the thickness $e_{mc}$ of the growth mask 20 and the thickness $e_{es}$ of the semiconductor stacks 30.

The conductive material thus makes contact with the upper face 20b of the growth mask 20 and with the upper face 30b of the semiconductor stacks 30. It may be transparent or reflective to the electromagnetic radiation emitted by the diodes 2, depending on whether the light is extracted through the p-doped second segments 33 or the n-doped first segments 31.

Figure 2F:
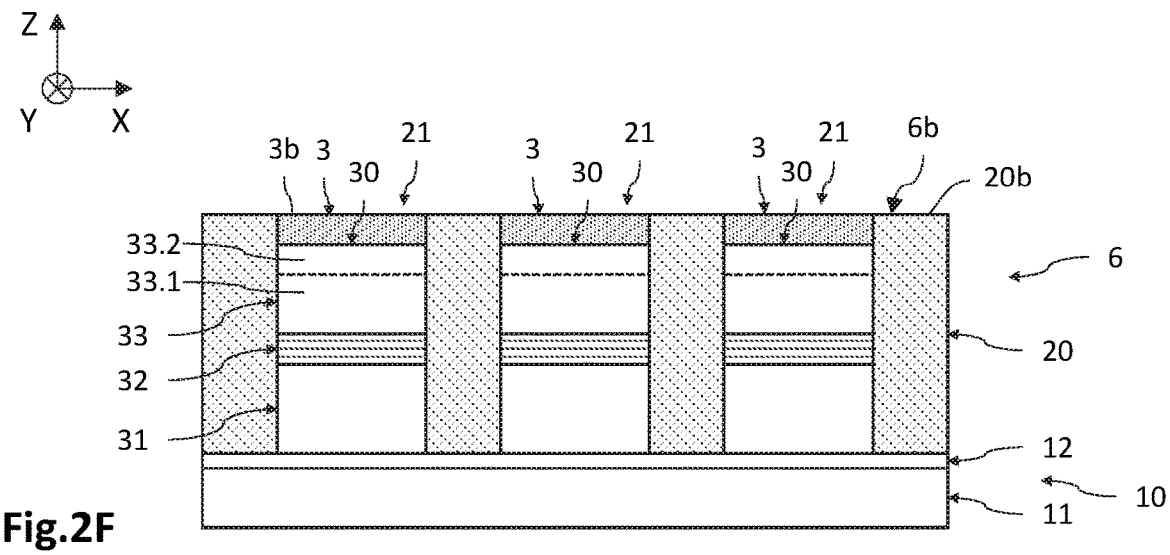

With reference to FIG. 2F, a planarization of the conductive layer 5 is carried out in order to remove the portions of the layer covering the growth mask 20, and to make a face 6b of the optoelectronic structure 6 continuous and substantially planar. The planarization may be a chemical-mechanical polish (CMP) and/or a dry etch. It is carried out with the upper face 20b of the growth mask 20 employed as etch-stop. Thus, a plurality of biasing electrodes 3, here anodes, that are distinct from one another, and mutually separated by the growth mask 20, are obtained. These biasing electrodes 3 are here called second electrodes and make contact with the p-doped second segments 33. First electrodes (cathodes) are intended to be produced in electrical contact with the n-doped first segments 31. The upper face 6b of the optoelectronic structure 6 is continuous and substantially planar, and is formed by the upper face 20b of the growth mask 20, which face is free, i.e., not covered by another material, and by the upper face 3b of the second electrodes 3.

Figure 2G:
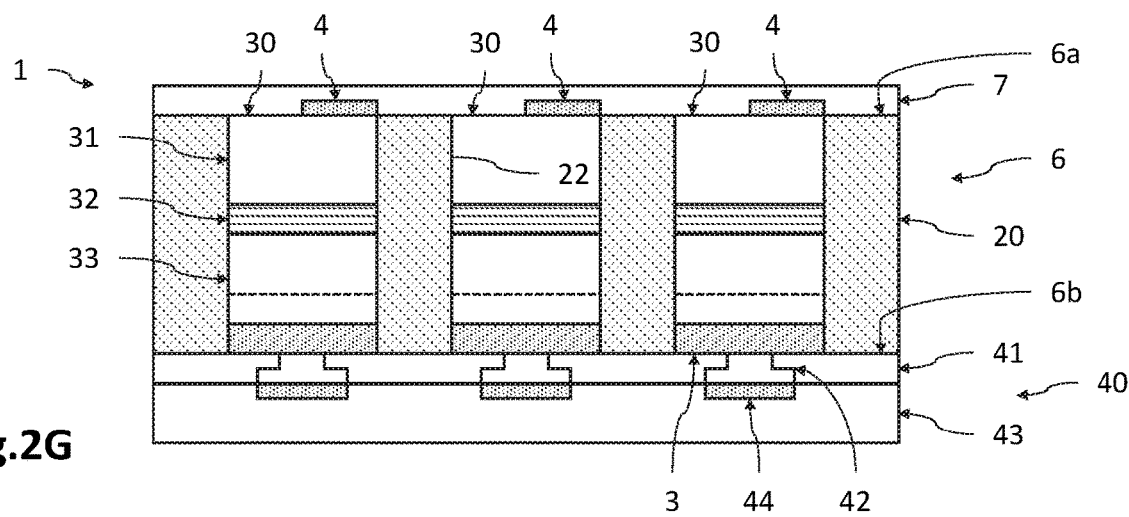

With reference to FIG. 2G, a hybridization of the optoelectronic structure 6 with a control chip 40 is carried out. By hybridization, what is meant is mechanical assembly and electrical connection. The substantially planar character of the upper face 6b of the optoelectronic structure 6 allows hybridization with the control chip 40 to be achieved, in particular by direct bonding. The upper face 6b of the optoelectronic structure 6 here forms a back electrical-connection face, the opposite front face 6a corresponding to the emission face.

The control chip 40 here comprises an (optional) electrical-connection layer 41 that is interposed between the optoelectronic structure 6 and an integrated-circuit layer 43, and that allows the electrical connection to be facilitated. The connecting layer 41 thus comprises electrical-connection elements 42 that ensure the connection between the second electrodes 3 and conductive segments 44 of the integrated-circuit layer 43. The connection elements 42 are electrically isolated from one another by a dielectric material. The connecting layer 41 here has a substantially constant thickness.

The integrated-circuit layer 43 is joined to the rear face 6b of the optoelectronic structure 6, here by means of the connecting layer. The control chip 40 notably ensures the electrical connection of the diodes 2, so as to control the emission of light by the light-emitting diodes. Thus, the conductive segments 44 here allow the light-emitting diodes 2 to be forward biased. The control chip 40 may also comprise electronic elements, such as transistors, that control the emission of the light-emitting diodes. Alternatively, it may be a passive component essentially comprising (e.g., consisting essentially of) only electrical connection lines connecting the conductive segments 44 to remote electronic elements.

The optoelectronic structure 6 may be fastened to the control chip 40 by direct bonding (also known as "molecular adhesion") between the conductive material of the second electrodes 3 and the conductive material of the connection elements 42 of the connecting layer, where appropriate. Alternatively, electrical-interconnect microbumps or microtubes and/or thermocompression bonding may also be used to fasten the optoelectronic structure and control chip.

In addition, here the growth substrate 10 is removed, for example by chemical-mechanical polishing, by dry etching, by laser lift-off (LLO) or by abrasive cutting, so as to expose the lower face of the n-doped first segments 31 as well as the lower face of the growth mask 20. The lower face 6a of the optoelectronic structure 6 is here continuous and substantially planar, and in this example forms the emission face of the optoelectronic device 1.

Biasing first electrodes 4 are then produced in electrical contact with the n-doped first segments 31. This stage is carried out by deposition, photolithography and etching, of an electrically conductive material that is transparent to the electromagnetic radiation emitted by the diodes 2, for example indium tin oxide (ITO) or ZnO. These first electrodes 4 may have a thickness of a few nanometers to a few tens or hundreds of nanometers. The electrodes 4 may take the form of separate pads or of regions of the same continuous layer.

A protective layer 7, made of a dielectric material transparent to the electromagnetic radiation, may then be deposited on the emission face 6a of the optoelectronic structure 6, so as to ensure structural protection of the diodes 2.

Thus, an optoelectronic device 1 is obtained, the optoelectronic structure 6 of which comprises a matrix-array of diodes 2 that are located in the through-apertures 21 of the growth mask 20 and that are isolated from each other by the latter. At least the n-doped first segments 31 and the active regions 32, and preferably also the p-doped second segments 33, are located in these through-apertures 21 and make contact with the lateral border 22 of the growth mask 20. This not only allows localized growth of the semiconductor stacks 30 but also ensures the passivation of the lateral flanks of the semiconductor stacks 30. As described above, the material of the semiconductor stacks 31 of the optoelectronic device 1 has a good crystal quality, thus improving the optical and/or electronic properties of the device.

FIGS. 3A to 3D illustrate, schematically and partially, certain stages of a process for fabricating an optoelectronic device 1 according to another embodiment. In this example, the process differs from that illustrated in FIGS. 2A to 2G essentially in that it does not comprise a stage of producing second electrodes 3 before hybridization with the control chip 40.

Figure 3A:
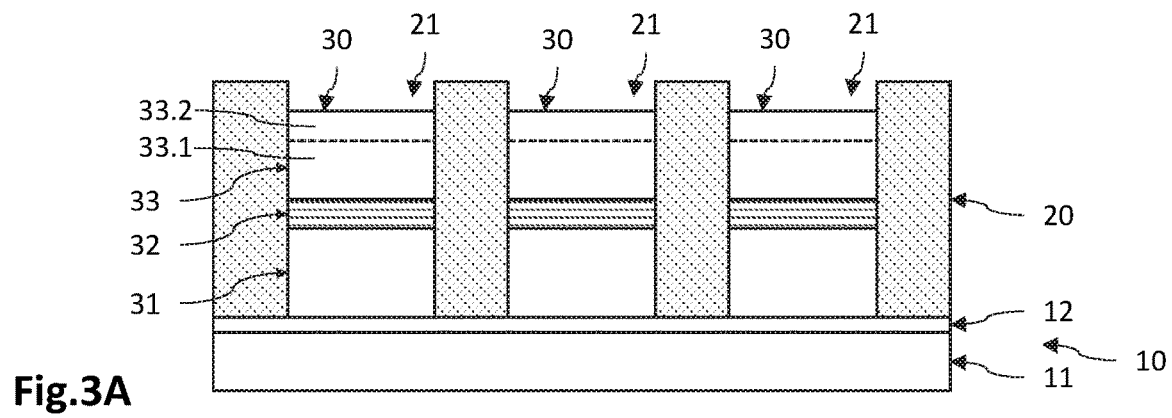
FIGS. 3A to 3D are schematic and partial views, in cross section, of various stages of a process for fabricating an optoelectronic device according to another embodiment not comprising producing biasing electrodes before hybridization.

FIG. 3A illustrates the structure obtained following the production of the semiconductor stacks 30 by epitaxial growth in the through-apertures 21. This structure is identical or similar to that described with reference to FIG. 2D and the fabricating stages carried out beforehand will not be described again.

Figure 3B:
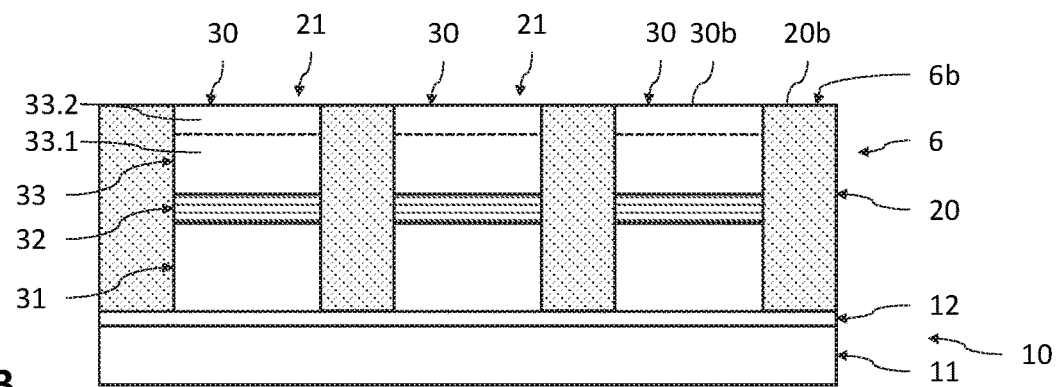

FIG. 3B illustrates a stage of planarizing the upper face 6b of the optoelectronic structure 6. To do this, the growth mask 20 is planarized by chemical-mechanical polishing and/or etching, with the upper face 30b of the semiconductor stacks 31 employed as etch-stop. Thus, the optoelectronic structure 6 has a continuous and substantially planar upper face 6b defined by the upper face 20b of the growth mask 20 and the upper face 30b of the semiconductor stacks 31, these upper faces 20b, 30b being substantially coplanar.

Figure 3C:
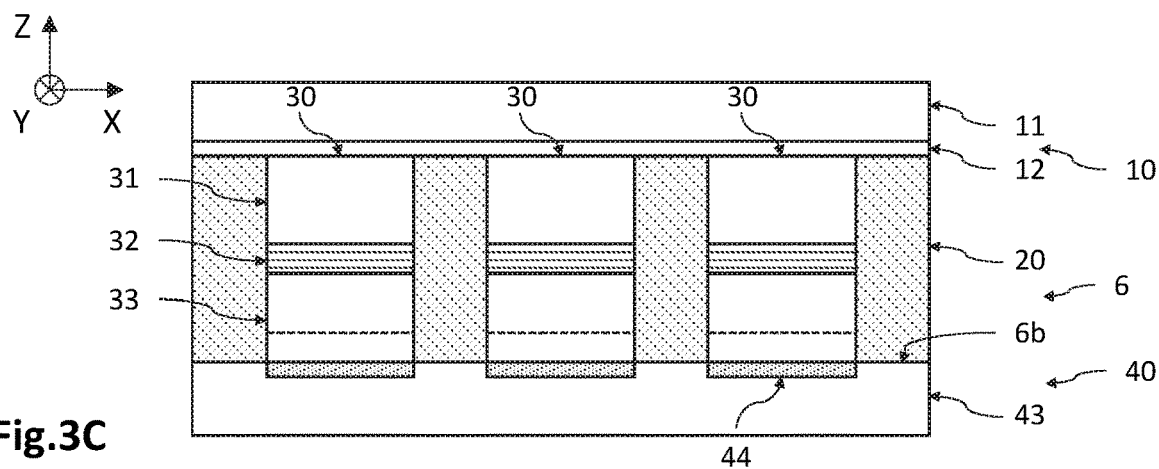

FIG. 3C illustrates the hybridization of the optoelectronic structure 6 thus obtained with a control chip 40. The substantially planar character of the upper face 6b of the optoelectronic structure 6 allows the hybridization to be achieved, for example by direct bonding.

In this example, the control chip 40 comprises an integrated-circuit layer 43, the connection face of which comprises conductive segments 44. As mentioned above, the latter may be connected to electronic elements, such as transistors, that control the emission of the light-emitting diodes, these electronic elements possibly being located in the control chip, or being remote elements. The conductive segments 44 may be separate pads, or be regions of the same continuous layer.

The optoelectronic structure 6 is here fastened to the control chip 40 by direct bonding between the semiconductor compound of the p-doped second segments 33 and the conductive material of the conductive segments 44 of the control chip 40. A connecting layer (not shown), which is identical or similar to that described with reference to FIG. 2G, may be interposed between the optoelectronic structure 6 and the integrated-circuit layer 43 of the control chip 40.

Figure 3D:
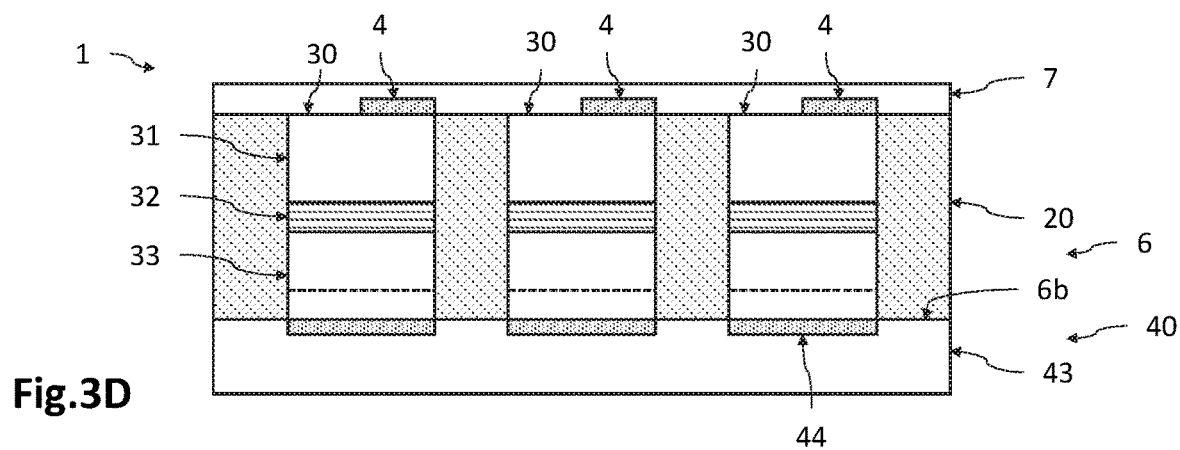

FIG. 3D illustrates the removal of the growth substrate 10, this freeing the lower face 6a of the optoelectronic structure 6, which thus becomes the emission face. Biasing first electrodes 4 are then produced so as to make electrical contact with the n-doped first segments 31, then the protective layer 7 is deposited. These stages have been described previously and are not detailed again.

Thus, an optoelectronic device 1 is obtained in which the p-doped second segments 33 of the optoelectronic structure 6 and the conductive segments 44 of the control chip 40 are direct bonded. This stage of hybridization by direct bonding is made possible by the prior planarization of the upper face 6b of the optoelectronic structure 6, which is carried out, after the stage of epitaxial growth of the semiconductor stacks 30, so as to decrease the thickness $e_{mc}$ of the growth mask 20.

Figure 4A:
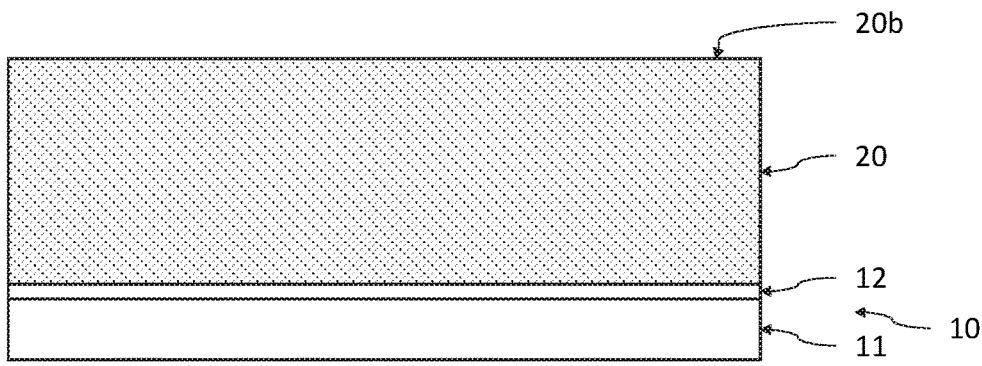
FIGS. 4A to 4C are schematic and partial views, in cross section, of various stages of a process for fabricating an optoelectronic device according to another embodiment in which each through-aperture is inclined.
Figure 4B:
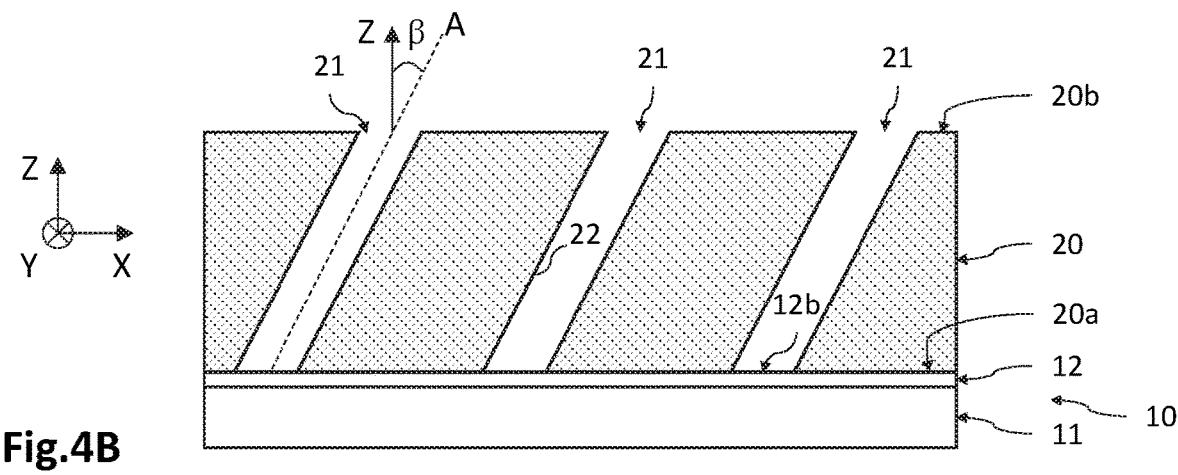
Figure 4C:
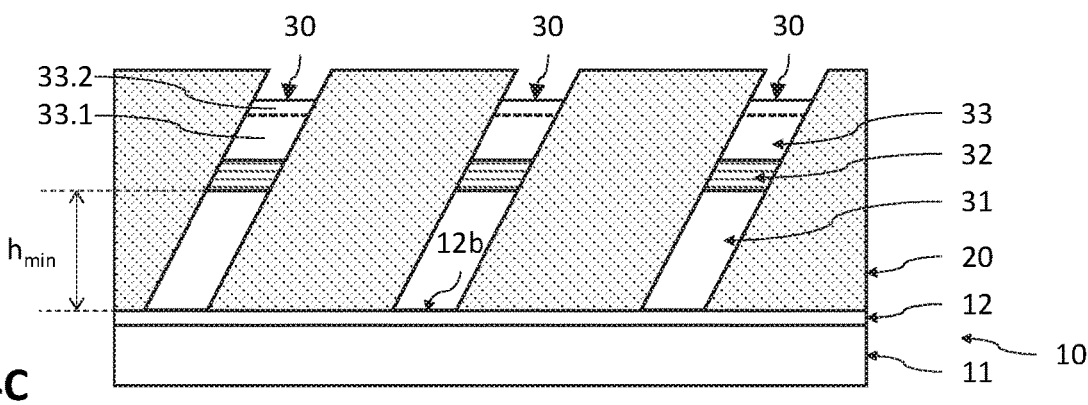

FIGS. 4A to 4C illustrate, schematically and partially, certain stages of a process for fabricating an optoelectronic device 1 according to another embodiment. In this example, the process differs from that illustrated in FIGS. 2A to 2G essentially in that the through-apertures 21 of the dielectric layer 20 are inclined with respect to the Z-axis.

FIG. 4A illustrates the deposition of the dielectric layer 20 on the growth substrate 10. This stage is identical or similar to that described with reference to FIG. 2B.

FIG. 4B illustrates the production of through-apertures 21 through the dielectric layer 20, for example by dry etching of the RIE type. Each through-aperture 21 extends from the upper face 20b of the dielectric layer 20 to open onto the nucleation surface 12b. The dielectric layer 20 then forms a growth mask.

The through-apertures 21 are here inclined with respect to the Z-axis, i.e., they extend along a director axis A, which makes a non-zero angle β to the Z-axis. Generally, the director axis A of a through-aperture 21 is a straight line passing through the center of those planar cross sections of the through-aperture 21 that lie parallel to the XY-plane. A planar cross section is here an intersection between the through-aperture 21 and a plane parallel to the XY-plane. The planar cross sections referred to as the lower and upper planar cross sections are those that are located level with the lower face 20a and with the upper face 20b of the growth mask 20, respectively. The lower planar cross section here opens onto the nucleation surface 12b of the through-aperture 21 in question.

In this example, the through-apertures 21 are all inclined at the same angle β. Moreover, the lateral border 22 of each aperture is substantially rectilinear, and is here substantially parallel to the director axis A. In fact, the shapes obtained may be less regular and rectilinear, but will approach the shapes illustrated in FIG. 4B. As a variant, the lateral border 22 may not be parallel to the director axis A, notably when the through-aperture 21 has a conical shape.

The angle of inclination β of the through-apertures 21 is advantageously chosen so that the upper planar section is not located plumb with, i.e., perpendicular to, the corresponding nucleation surface 12b. In other words, the upper planar cross section and the lower planar cross section are not secant in projection along the Z-axis. Preferably, as illustrated in FIG. 4B, the angle of inclination β is chosen so that, from a planar cross section referred to as the minimum planar cross section, which is located, along the Z-axis, at a height $h_{min}$ with respect to the nucleation surface 12b, the planar cross sections are not located plumb with the corresponding nucleation surface 12b. Thus, each active region 32 is advantageously located at a distance from the nucleation surface 12b, along the Z-axis, greater than or equal to $h_{min}$.

FIG. 4C illustrates the production of semiconductor stacks 30 in the through-apertures 21. As described above, the n-doped first segments 31 are produced from the nucleation surface 12b of each through-aperture 21, for example by MOCVD. They advantageously have a thickness at least equal to the minimum height $h_{min}$. It will be recalled that thickness is here a dimension measured along the Z-axis. The active regions 32 are formed from the n-doped first segments 31, then the p-doped second segments 33 are produced.

Thus, in this example, the active region 32 is located at a distance, along the Z-axis, at least equal to the height $h_{min}$, and hence it is not located plumb with the nucleation surface 12b. This configuration is particularly advantageous insofar as it prevents structural defects such as threading dislocations from being unable to propagate vertically as far as the active region 32. This is notably relevant to the case where the semiconductor stacks 30 are made based on a III-N compound the crystal lattice of which is of the wurtzite (hexagonal) type. The internal quantum efficiency of the active region 32, and therefore the optical and/or electronic properties of the optoelectronic device 1, are thus improved.

In the case where the growth mask 20 at least partially overhangs the active region 32, the material of the growth mask 20 is furthermore chosen to be transparent to the electromagnetic radiation emitted or detected by the diodes.

Figure 5A:
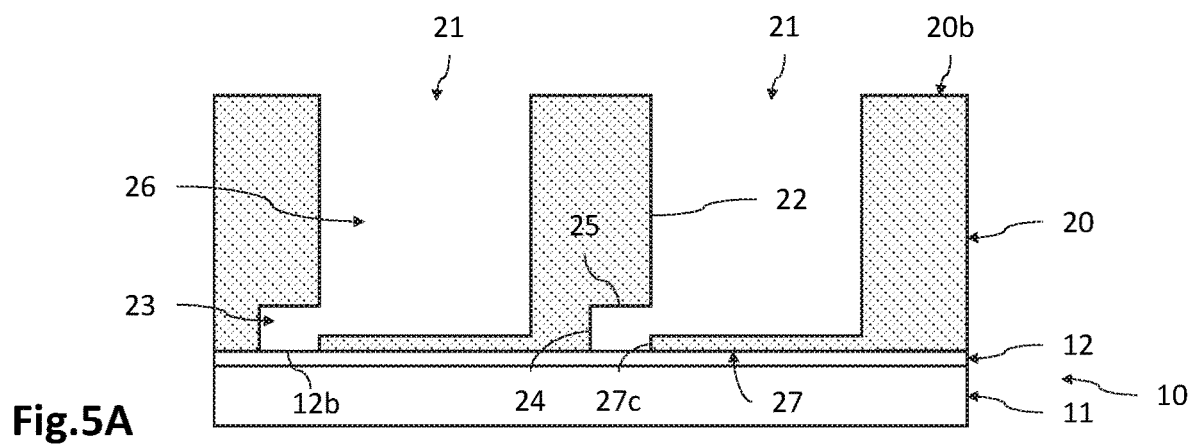
FIGS. 5A to 5C are schematic and partial views, in cross section, of various stages of a process for fabricating an optoelectronic device according to another embodiment in which each through-aperture is structured so as to comprise a plurality of distinct cavities.
Figure 5B:
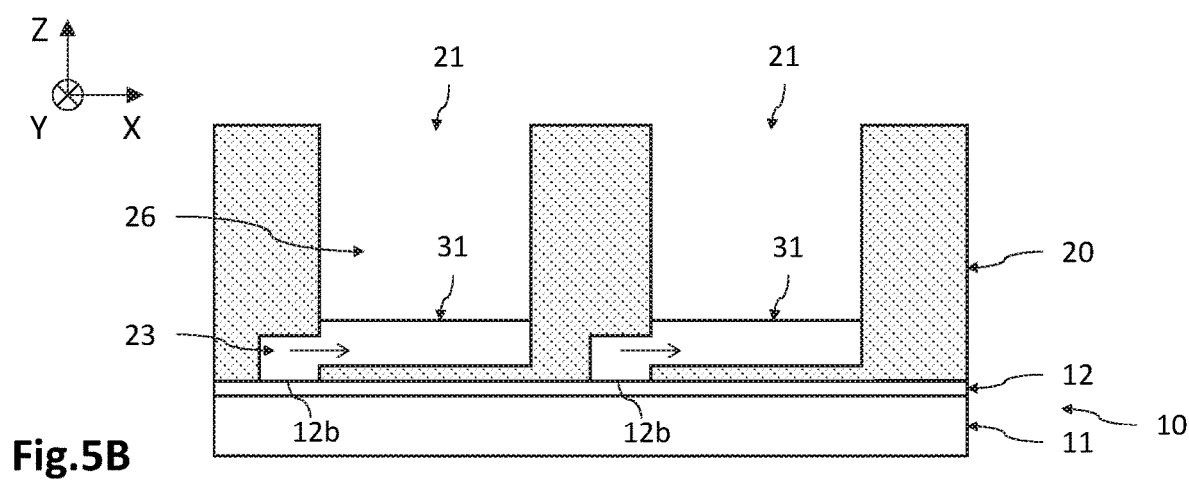
Figure 5C:
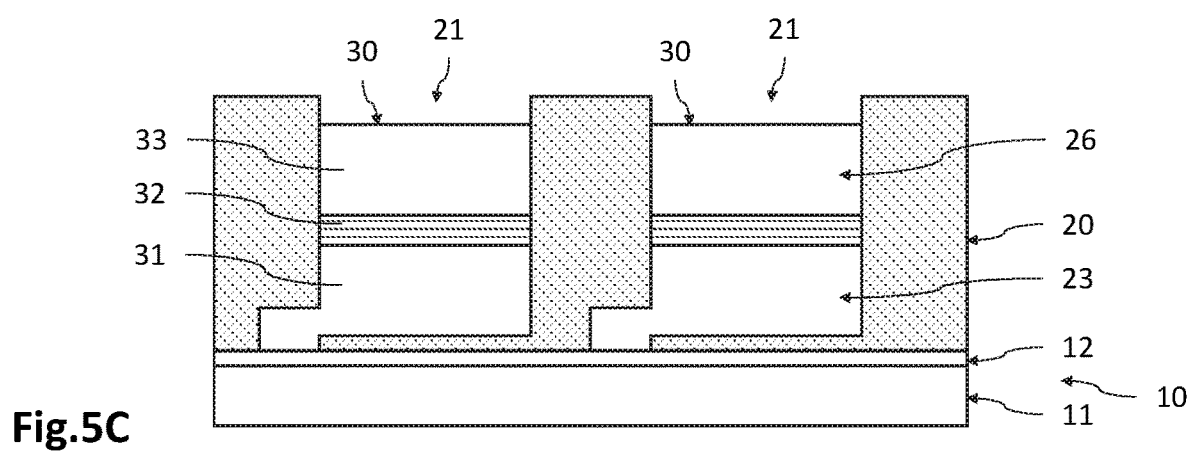

FIGS. 5A to 5C illustrate, schematically and partially, certain stages of a process for fabricating an optoelectronic device 1 according to another embodiment. In this example, the process differs from that illustrated in FIGS. 4A to 4C essentially in that the through-apertures 21 are structured so as to form a plurality of distinct cavities 23, 26 that communicate with one another.

FIG. 5A illustrates the production of the structured through-apertures 21. In this example, each through-aperture 21 comprises a lower cavity 23 that opens onto the nucleation surface 12b, and an upper cavity 26 that opens onto the upper face 20b of the growth mask 20. The two cavities 23, 26 communicate with each other. Generally, the structured through-apertures 21 may comprise more than two distinct cavities. The various cavities 23, 26 may be produced at various times, during the stage of producing the growth mask 20, using conventional stages of deposition, photolithography and etching.

The lower cavity 23 is here bounded in the −Z-direction by the nucleation surface 12b, in the +Z-direction by an upper surface 25 of the growth mask 20 opposite the nucleation surface 12b, and is partially bounded laterally, on the one hand, by a lateral surface 24 of the growth mask 20, which extends as far as the upper surface 25, and, on the other hand, by a lateral surface 27c of a lower portion 27 of the growth mask 20. It is partially and not completely bounded laterally so as to be able to communicate with the upper cavity 26.

The upper cavity 26 is bounded laterally by the lateral border 22, and in the −Z-direction by the lower portion 27 of the growth mask 20. This lower portion 27 here rests on the growth substrate 10. In this example, it is advantageous for the upper cavity 26 to be offset laterally with respect to the lower cavity 23 so that threading dislocations generated in the lower cavity 23 cannot propagate vertically into the upper cavity 26. To this end, the upper surface 25 of the lower cavity 23 extends in the XY-plane so as to be plumb with all of the underlying nucleation surface 12b. Preferably, the surface 25 covers a portion of the lower portion 27, i.e., it is partly located opposite the portion 27.

FIG. 5B illustrates a phase of epitaxial growth of the n-doped first segments 31 from the nucleation surface 12b of each through-aperture 21. Each n-doped first segment 31 nucleated on the nucleation surface 12b located in the lower cavity 23 grows to gradually fill the lower cavity 23 and enter the upper cavity 26, then continues to grow, gradually filling the upper cavity 26.

During epitaxial growth, the operating conditions of the epitaxy reactor may be modified to promote vertical growth with respect to lateral growth, or vice versa. In the case of the growth of a III-V compound by MOCVD, the pressure in the reactor, the V/III ratio between the molar flow of the group-V element and the molar flow of the group-III element, and/or the $H_2/N_2$ ratio between the flow of $H_2$ and the flow of $N_2$, may thus be modified. Thus, the growth conditions may first be set to promote vertical growth, until most of the lower cavity 23 is filled, and may then be modified to promote lateral growth, so as to cause a gradual extension into the upper cavity 26, and may then be modified to again promote vertical growth, so as to complete the formation of the n-doped first segments 31, and to produce the active regions 32 and then the p-doped second segments 33.

FIG. 5C illustrates the structure obtained following the stage of producing the semiconductor stacks 30, after the epitaxy of the active regions 32 and that of the p-doped second segments 33 in the upper cavity 26 of the through-apertures 21. Thus, because of the lateral offset of the upper cavity 26 with respect to the lower cavity 23, vertical propagation of structural defects formed in the lower cavity 23, such as threading dislocations, into the active region 32 is limited or even avoided. The crystal quality of the active region 32 is thus improved, this thus increasing its internal quantum efficiency and improving the optical and/or electronic properties of the optoelectronic device 1.

FIGS. 6A to 6D illustrate, schematically and partially, certain stages of a process for fabricating an optoelectronic device 1 according to another embodiment. In this example, the process differs from that illustrated in FIGS. 2A to 2G essentially in that the through-apertures 21 are bounded in the −Z-direction by a dielectric region 13 of the growth substrate 10 and not by a nucleation surface 12b or by a portion 27 of the growth mask 20.

Figure 6A:
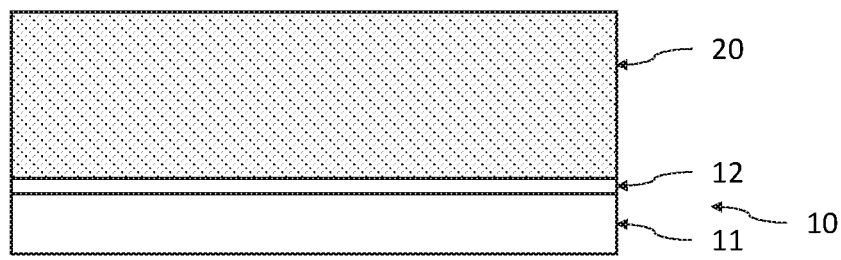
FIGS. 6A to 6D are schematic and partial views, in cross section, of various stages of a process for fabricating an optoelectronic device according to another embodiment in which each through-aperture opens onto a dielectric region located in the growth substrate, the nucleation surface extending around the periphery of the through-aperture.

FIG. 6A illustrates the deposition of the dielectric layer 20 on the growth substrate 10. This stage is identical or similar to that described with reference to FIG. 2B. In this example, the growth substrate 10 is formed from a nucleation layer 12 which coats the upper face of the carrier substrate 11, which is here produced based on silicon.

Figure 6B:
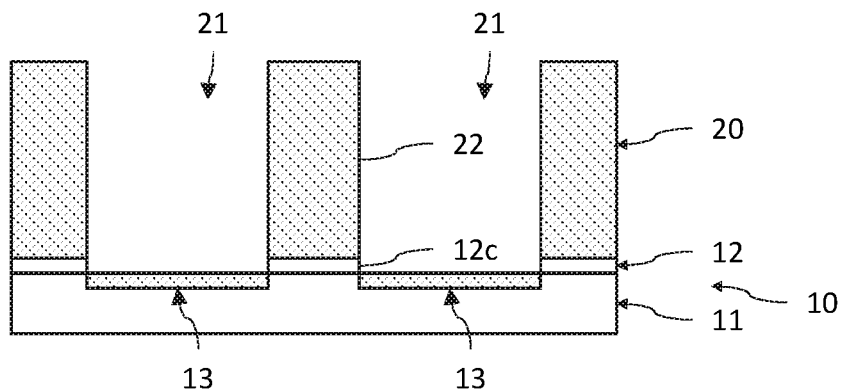

FIG. 6B illustrates the structure obtained after the through-apertures 21 have been produced. The latter are bounded in the −Z-direction by the upper face of the carrier substrate 11, here formed by the upper face of a dielectric region 13 that extends through the carrier substrate 11. They are bounded laterally by a lateral face 12c of the nucleation layer 12 and by the lateral border 22 of the growth mask 20. Thus, the nucleation surface, which opens into the through-apertures 21, is the lateral border 12c of the nucleation layer 12, which here extends on the one hand along the Z-axis and on the other hand around the perimeter of the through-aperture 21.

To achieve this, the through-apertures 21 may be formed by dry etching of RIE type, with the upper face of the carrier substrate 11 employed as etch-stop. In this example, the carrier substrate 11 being made based on silicon, and preferably being a layer of silicon, the dielectric region 13 may be obtained by localized thermal oxidation or nitridation of the silicon of the carrier substrate 11. The dielectric region 13 is then essentially formed from silicon nitride or silicon oxide. The depth of the dielectric region 13 may be in a range between 5 nm and 100 nm, and is preferably greater than or equal to 10 nm.

The nitriding stage may be carried out with ammonia, in a dedicated furnace or in the epitaxy reactor. The stage of thermal oxidation may be carried out with oxygen or water vapor, in a dedicated furnace. This stage may comprise exposing the structure to a temperature equal to about 1000° C., for a time ranging from a few minutes to one hour.

Figure 6C:
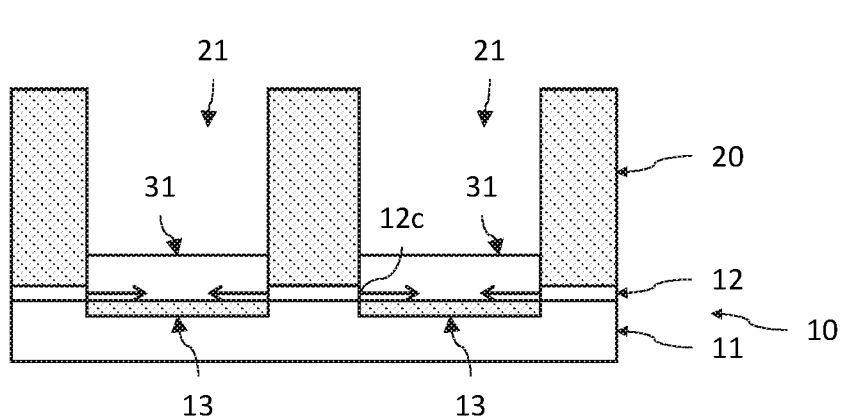

FIG. 6C illustrates a phase of epitaxial growth of the n-doped first segments 31 from the nucleation face 12c in each through-aperture 21. Thus, it is advantageous, in the case of the growth of a III-V compound by MOCVD, for the nucleation and growth conditions to be defined so as to initially promote lateral growth of the semiconductor compound in the XY-plane. When a lower region of the through-aperture 21 is filled with the n-doped first segment 31, the growth conditions may be modified so as to promote vertical growth.

Figure 6D:
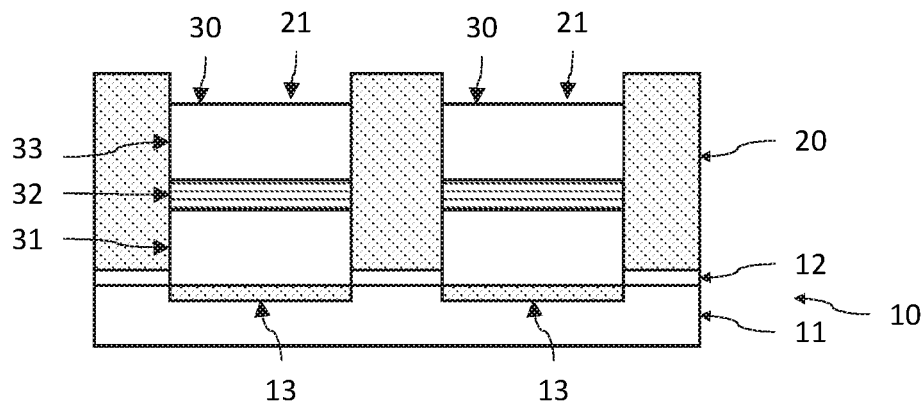

FIG. 6D illustrates the structure obtained following the stage of producing the semiconductor stacks 30, i.e., after the epitaxial growth of the active regions 32 and of the p-doped second segments 33 in the through-apertures 21.

Figure 7A:
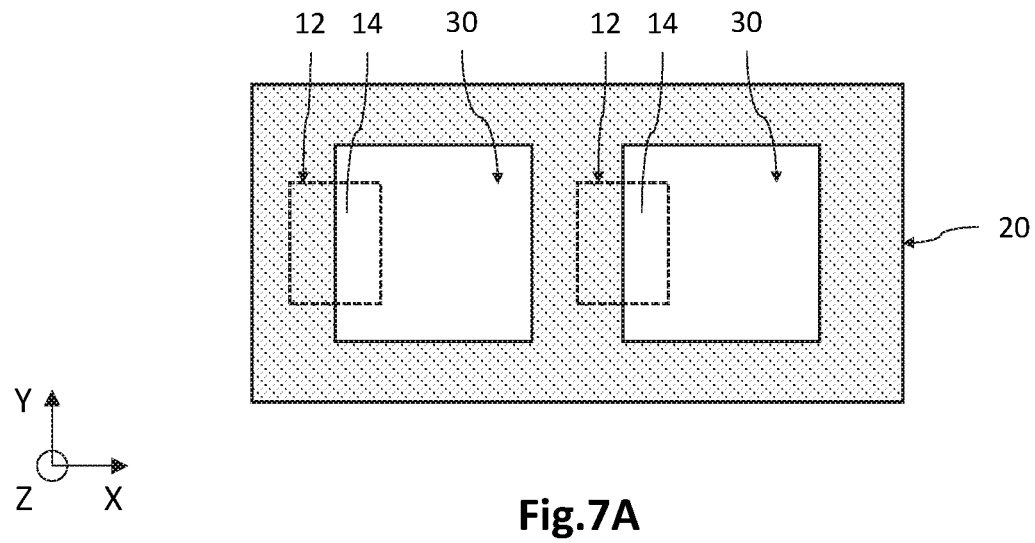
FIGS. 7A and 7B are schematic and partial views from above (FIG. 7A) and in cross section (FIG. 7B) of an optoelectronic device obtained using a fabricating process according to one variant of the embodiment illustrated in FIGS. 6A to 6D.
Figure 7B:
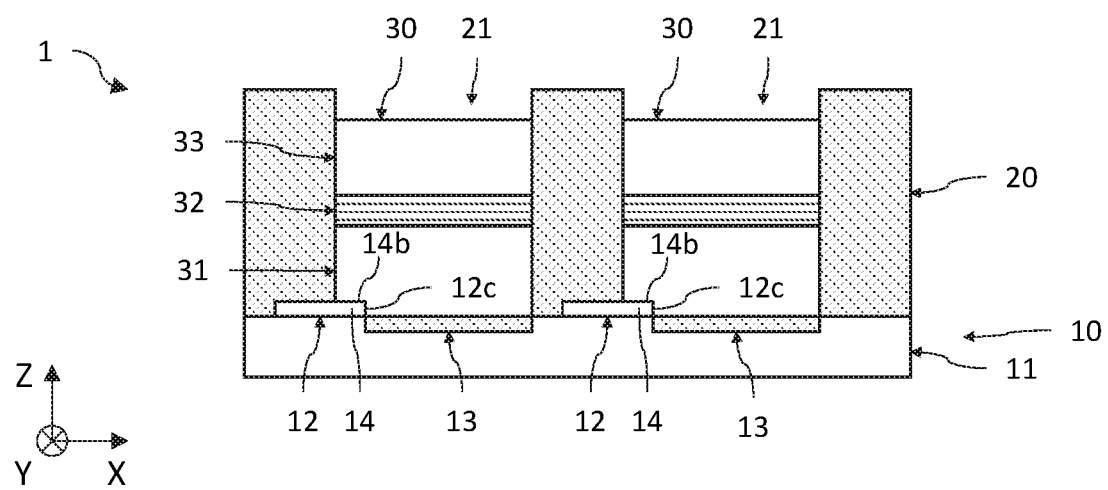

FIGS. 7A and 7B illustrate, schematically and partially, seen from above (FIG. 7A) and in cross section (FIG. 7B), an optoelectronic device 1 obtained using a fabricating process according to a variant of the embodiment illustrated in FIGS. 6A to 6D. In this example, the process differs from that illustrated in FIGS. 6A to 6D essentially in that a protruding portion 14 of the nucleation layer 12 extends into the through-aperture 21, and is therefore not covered by the growth mask 20. The protruding portion 14 extends into the through-aperture 21 only around a segment of its perimeter.

Thus, the through-apertures 21 are bounded in the −Z-direction by the dielectric region 13 and by the protruding portion 14 of the nucleation layer 12. They are bounded laterally essentially by the lateral border 22 of the growth mask 20.

During the epitaxial growth of the n-doped first segments 31, nucleation takes place essentially on the upper face 14b of the protruding portion 14 of the nucleation layer 12. The n-doped first segments 31 may grow vertically and laterally, depending on the growth conditions set. It is advantageous for the growth to initially be mainly lateral. When the n-doped first segments 31 fill a lower region of the through-apertures 21, the growth conditions may be modified so as to promote vertical growth.

Thus, the crystal quality of the material of the semiconductor stack is improved, by avoiding the coalescence of the semiconductor compound that occurs when it is nucleated on a nucleation surface 12b such as illustrated in FIG. 6C, i.e., on a nucleation face 12c that extends around the entire perimeter of the through-aperture 21, such a coalescence possibly resulting in the formation of structural defects.

Preferably, each through-aperture 21 comprises a single nucleation surface 12b, and not a plurality of nucleation surfaces 12b that are separate from one another. In addition, the nucleation surface 12b extends around a portion of the outline of the through-aperture 21, and not right around the outline thereof. Furthermore, the nucleation lateral face 12c extends, in an XY-plane, parallel to the plane of the carrier substrate 11, in a convex or continuously rectilinear manner. Thus, nucleation of the semiconductor compound from various separate nucleation surfaces 12b, which may be oriented towards one another (notably in the case of a concave nucleation surface), which may then lead to a coalescence of the semiconductor compound, liable to generate structural defects that extend as far as to the active region, is avoided. This improves the optical and/or electronic properties of the diodes 2.

Specifically, in the case where the nucleation surface 12b extends around a portion of the outline of the through-aperture 21 but has a concave shape, for example an L or U shape, it is possible for the semiconductor compound to nucleate and grow from the ends of the L or U, in order subsequently to coalesce and form structural defects that may extend as far as to the active region. The nucleation surface 12b would thus have an L shape if it extended along two adjacent flanks of the through-aperture 21, and would have a U shape if it extended along three flanks.

For the sake of clarity, it will be noted that the nucleation surface 12b may be formed by the nucleation lateral face 12c alone. This is particularly the case when the latter is flush with the lateral border 22: FIGS. 6A to 6D and FIGS. 8A to 8B. This is also the case when the protruding portion 14 has an upper face coated with a thin dielectric layer 15: FIGS. 9A to 9B. As a variant, the nucleation surface 12b may be formed by the nucleation lateral face 12c as well as by the upper face 14b of the protruding portion 14: FIGS. 7A to 7B.

Figure 8A:
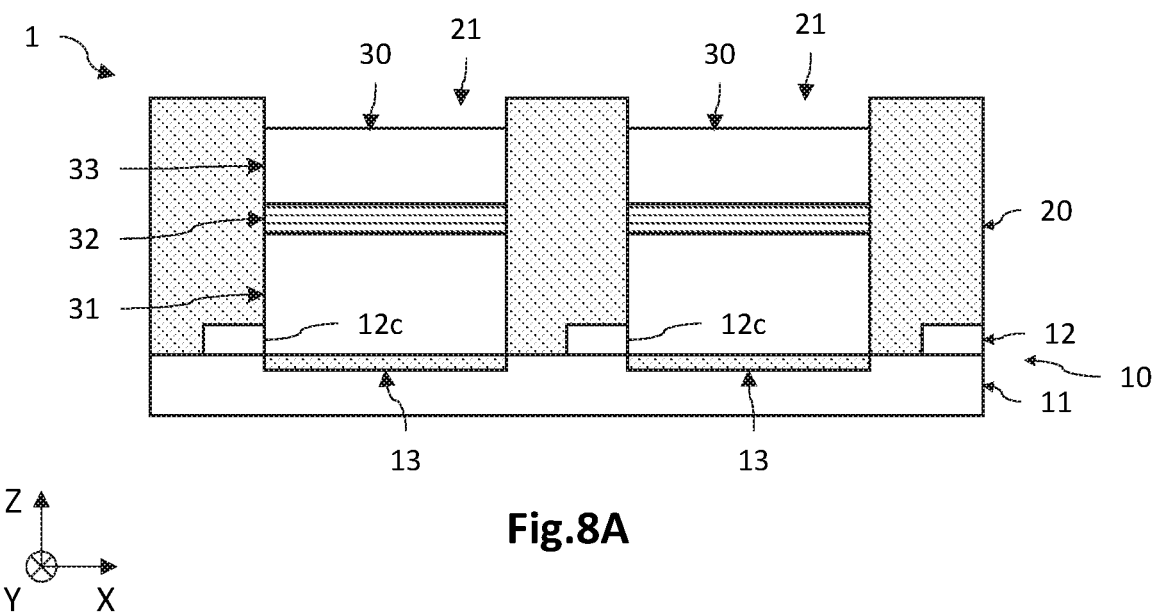
FIGS. 8A and 8B are schematic and partial views in cross section (FIG. 8A) and from above (FIG. 8B) of an optoelectronic device obtained using a fabricating process according to one variant of that described with reference to FIGS. 6A to 6D.
Figure 8B:
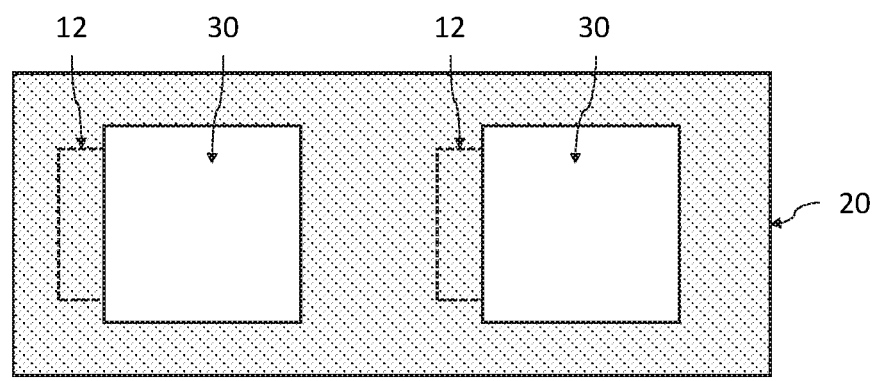
Figure 9A:
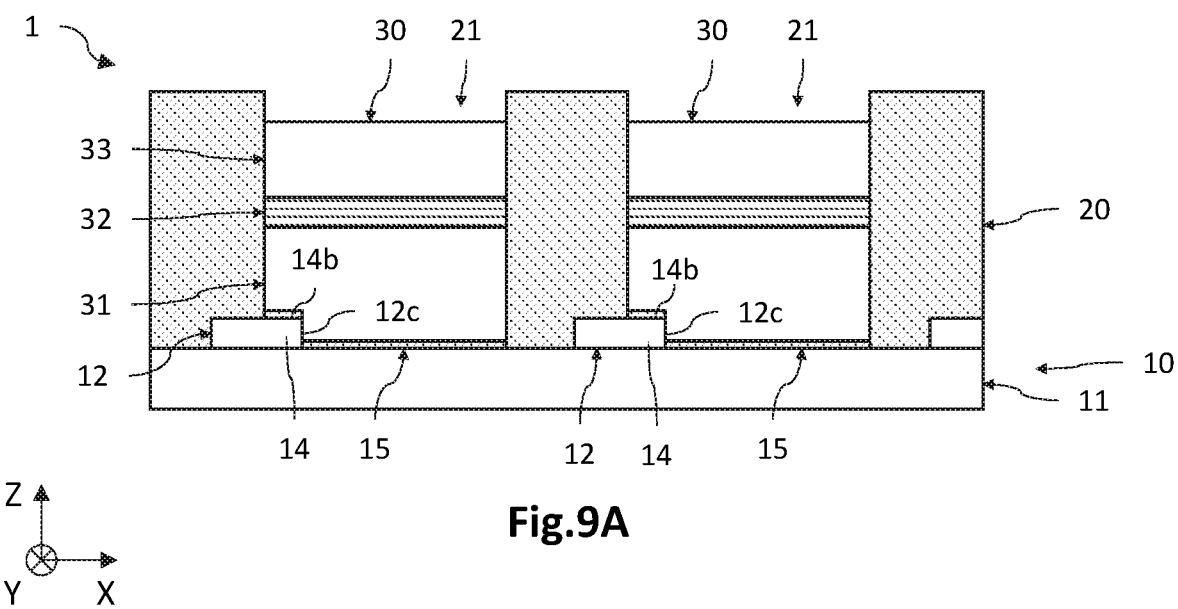
FIGS. 9A and 9B are schematic and partial views in cross section (FIG. 7A) and from above (FIG. 7B) of an optoelectronic device obtained using a fabricating process according to one variant of the embodiment illustrated in FIGS. 7A to 7B.
Figure 9B:
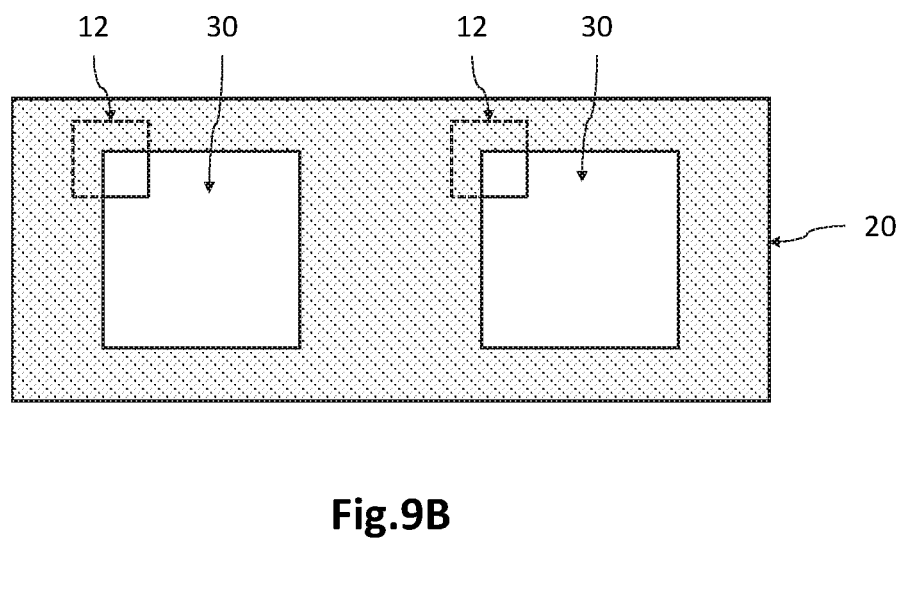

FIGS. 8A and 8B are schematic and partial views of an optoelectronic device 1 according to a variant of that illustrated in FIGS. 6A to 6D, and which differs therefrom notably in that the nucleation lateral face 12c extends, in the XY-plane, around only one portion of the outline of the through-aperture 21 in a manner that is continuously rectilinear (to within technological uncertainty).

In this case, the lateral face 12c is flush with the lateral border 22 of the dielectric layer 20 along the Z-axis, and extends in the XY-plane in a continuously rectilinear manner. In other words, the lateral face 12c remains contained in the same plane: a segment [AB] formed from any two points of the lateral face 12c remains contained in the lateral face 12c. The nucleation surface 12b then does not protrude into the through-aperture 21. The through-aperture 21 then has a polygonal and not circular shape in the XY-plane, and the lateral face 12c extends in a rectilinear (not curved) manner over part or all of only one flank of the through-aperture 21. Thus, the lateral face 12c does not extend over two adjacent flanks of the through-aperture 21, as if it did the nucleation surface 12b would have a substantially concave (non-convex) shape that would possibly lead to a coalescence of the epitaxial semiconductor compound, which coalescence would be liable to form structural defects that could degrade the active region.

The semiconductor compound is therefore grown epitaxially from the lateral face 12c, which extends over one portion of the outline of the through-aperture 21 in a continuously rectilinear manner, this allowing the risk of coalescence of the epitaxial semiconductor compound liable to generate structural defects that could degrade the active region to be avoided. Furthermore, in this example, the bottom surface, which bounds the through-aperture 21 in the −Z-direction, is here formed by an oxidized or nitrided region of the silicon of the carrier substrate 11. As a variant, it may be defined by a thin dielectric layer, for example a silicon nitride covering only the carrier substrate 11, and not entirely covering the lateral face 12c.

FIGS. 9A and 9B are schematic and partial views of an optoelectronic device 1 according to a variant of that illustrated in FIGS. 7A to 7B. In these two examples, each through-aperture 21 comprises a single nucleation surface 12b, which extends over one portion of the outline of the through-aperture 21. In addition, the nucleation lateral face 12c extends in the XY-plane in a manner that is convex (to within technological uncertainty).

The nucleation surface 12b then comprises a portion 14 that protrudes into the through-aperture 21, which forms a convex set in the mathematical sense of the expression. In other words, the protruding portion 14 of the nucleation surface 12b, extends, in the XY-plane, into the through-aperture 21 in such a way that, for any two points A and B of the protruding portion 14, the segment [AB] which joins them is entirely contained therein. The through-aperture 21 may have a polygonal or rounded (oval, circular, etc.) shape in the XY-plane. In the case of a polygonal shape, the nucleation surface may extend along part or all of one or more flanks of the through-aperture 21. In any event, the nucleation surface 12b forms a convex-set shape, thus minimizing the risk of coalescence of the epitaxial semiconductor compound which could form structural defects that could degrade the active region.

Thus, in FIGS. 9A and 9B, the nucleation surface 12b is formed by a protruding portion 14 that partially extends along two adjacent flanks of the through-aperture 21, and that is located in a corner thereof. It has a convex shape, just like that illustrated in FIGS. 7A and 7B. The through-aperture 21 comprises only one nucleation surface 12b and not a plurality of nucleation surfaces 12b that are separate from one another.

However, whereas in the example of FIGS. 7A and 7B, the nucleation surface 12b is formed by the upper face 14b and by the lateral face 12c, in the example of FIGS. 9A and 9B it is formed solely by the lateral face 12c. Specifically, the upper face 14b of the protruding portion 14 is coated with a thin dielectric layer 15, for example a silicon nitride, which also forms the dielectric region 13. This thin dielectric layer 15 does not entirely cover the vertical flank of the protruding portion 14, and hence the free surface defines the nucleation lateral face 12c.

Thus, the semiconductor compound is therefore grown epitaxially from the lateral face 12c of the protruding portion 14 of the nucleation surface 12b, which is located in a corner of the through-aperture 21, which then has a convex shape and not a concave (not an L or U shape, for example), this allowing the risk of coalescence of the epitaxial semiconductor compound liable to generate structural defects that could degrade the active region to be avoided.

FIGS. 10A to 10E illustrate a process for fabricating an optoelectronic device 1 according to a variant of that described above with reference to FIGS. 2A to 2G.

Figure 10A:
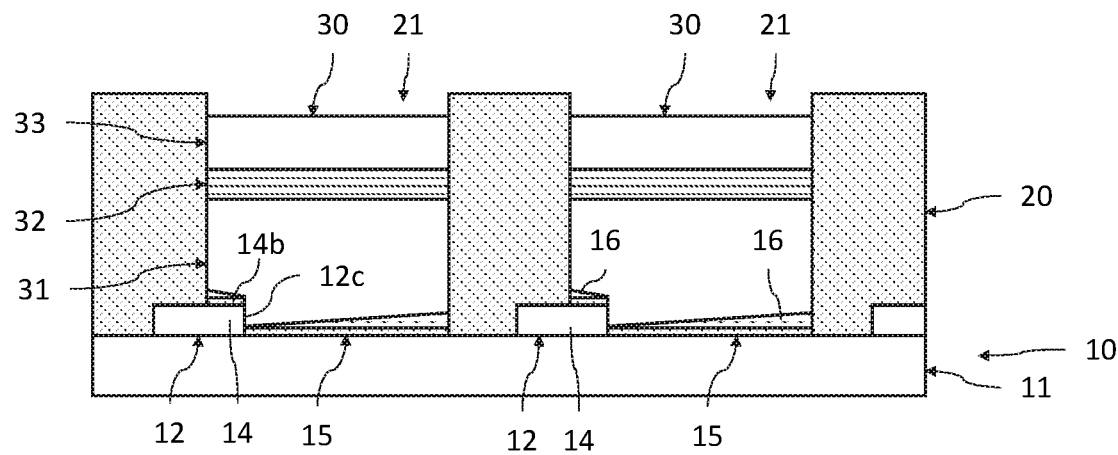
FIGS. 10A to 10E are schematic and partial views, in cross section, of various stages of a process for fabricating an optoelectronic device according to another embodiment.

In this example, the nucleation surface 12b is similar or identical to that described with reference to FIGS. 9A to 9B. It turns out that, in this embodiment, just as in that of FIGS. 7A to 7B, in which the semiconductor compound is grown epitaxially from a nucleation lateral face 12c and in which the bottom surface is formed by a dielectric region 13 (oxidized or nitrided region, or dielectric thin layer 15), an empty space 16 may form between the epitaxial semiconductor compound and the upper face of the dielectric region 13. In the example of FIG. 10A, this empty space 16 is located above the thin dielectric layer 15, both level with the portion making contact with the carrier substrate 11, and level with the portion making contact with the protruding portion 14. This empty space 16 may form during the epitaxial growth of the semiconductor compound along privileged crystal planes, given that it grows from the lateral face 12c in a main growth direction oriented along the Z-axis.

With reference to FIG. 10A, the semiconductor stacks 30 are produced in the through-apertures 21, from the nucleation lateral faces 12c. By way of example, the protruding portion may have a thickness of about 300 nm and protrude over a distance of about 200 nm. The thin dielectric layer 15 may have a thickness of 10 nm to 20 nm. Thus, the nucleation lateral face 12c has a height along the Z-axis of about 280 nm. The thickness of the doped segment 31 may be a few microns. The doped segment 31 may be a semiconductor compound based on GaN, at least the portion of which making contact with the active region 32 is n-doped.

Figure 10B:
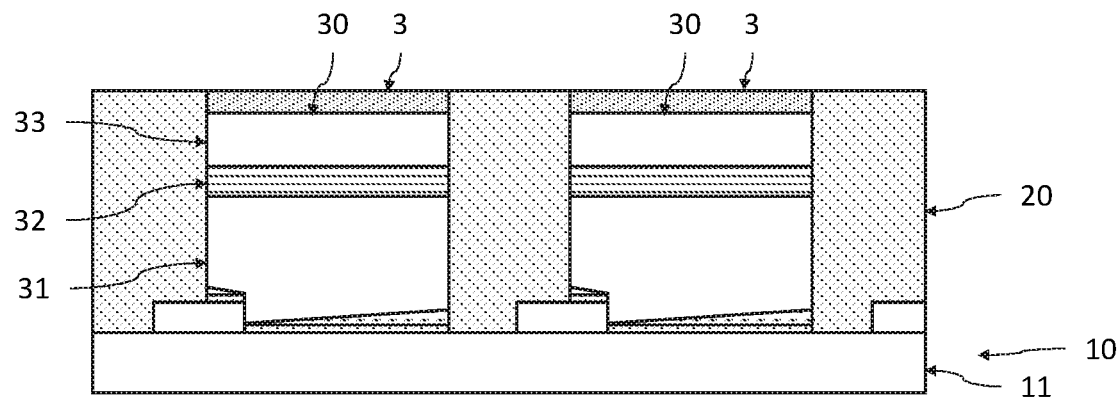

With reference to FIG. 10B, the biasing electrodes 3 are then produced, in an identical or similar way to the stages described above with reference to FIGS. 2E and 2F, or even to FIG. 3C.

Figure 10C:
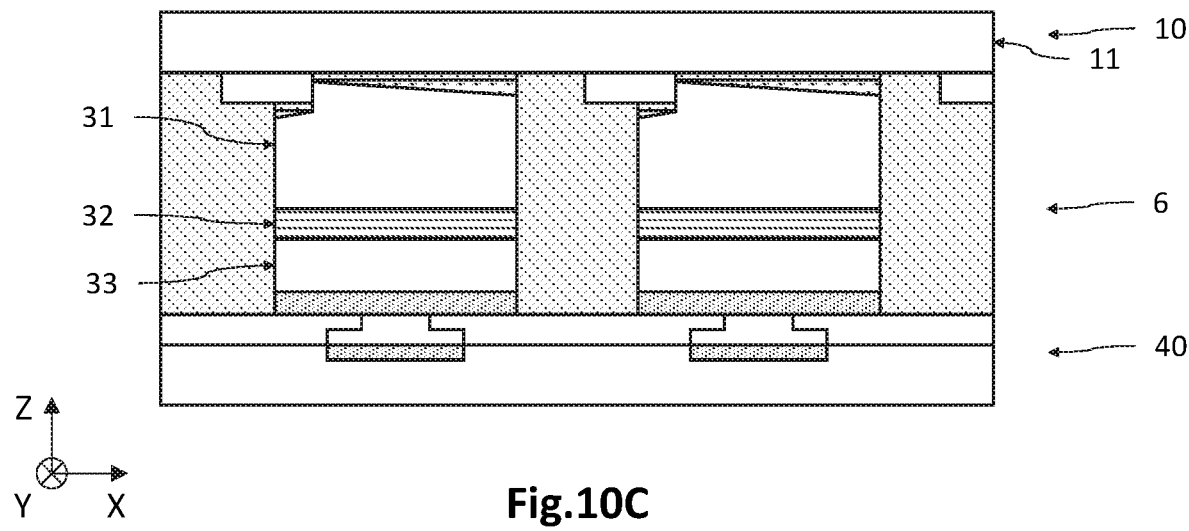

With reference to FIG. 10C, a hybridization of the optoelectronic structure 6 with a control chip 40 is carried out. This hybridization is similar or identical to that described with reference to FIG. 2G, but it may be identical or similar to that of FIG. 3D.

Figure 10D:
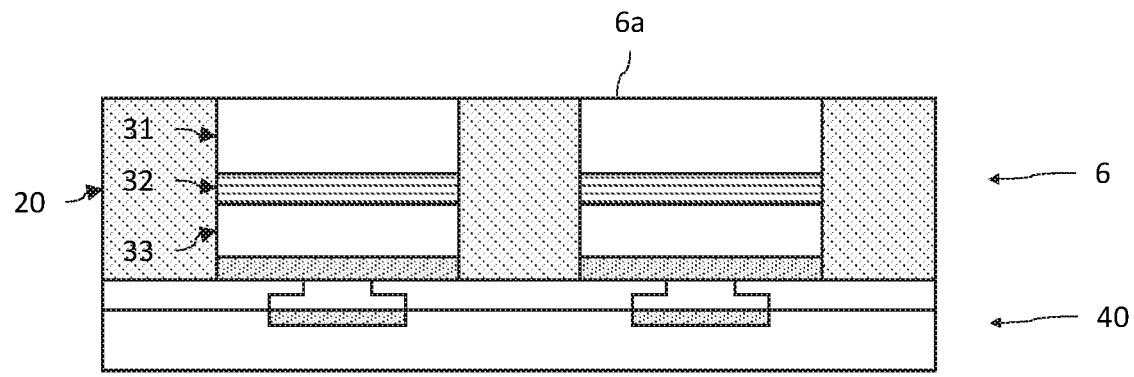

With reference to FIG. 10D, not only is the growth substrate 10 then removed, but also a portion of the doped segments 31, for example by chemical-mechanical polishing, dry etching, LLO, abrasive cutting, etc. The removed portion of the doped segments 31 comprises the one or more empty spaces 16. An optoelectronic structure 6, the lower face 6a of which is continuous and substantially planar, is thus obtained. Moreover, the remaining doped segments 31 are free of empty spaces resulting from the nucleation of the semiconductor compound.

Figure 10E:
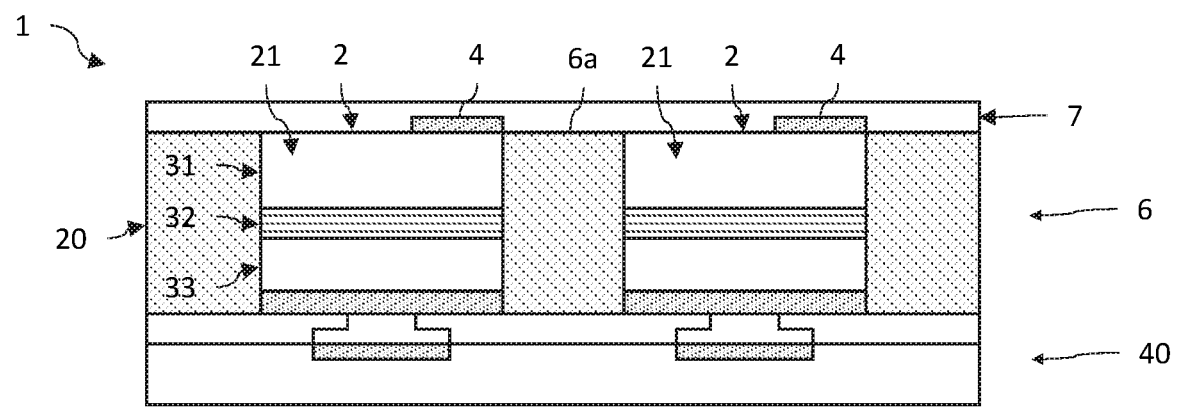

With reference to FIG. 10E, first biasing electrodes 4 are then produced in electrical contact with the n-doped first segments 31. A protective layer 7, made of a dielectric material that is transparent to the electromagnetic radiation, may then be deposited on the emission face 6a of the optoelectronic structure 6, so as to ensure structural protection of the diodes 2.

Thus, an optoelectronic device 1 is obtained, the optoelectronic structure 6 of which comprises a matrix-array of diodes 2 that are located in the through-apertures 21 of the growth mask 20 and that are isolated from each other by the latter. As described above, the material of the doped segments 31 and of the active region 32 of the optoelectronic device 1 has a good crystal quality insofar as the risk of coalescence of the epitaxial semiconductor compound liable to form structural defects that could extend as far as to the active region is avoided.

Particular embodiments have just been described. They are not mutually exclusive and may be combined with one another, and hence various variants and modifications will appear obvious to those skilled in the art. Thus, in the various variants, the through-apertures 21 may be inclined along a director axis making a non-zero angle β to the Z-axis and/or be structured so as to comprise a plurality of cavities that are distinct from one another.

The invention claimed is:

1. A process for fabricating an optoelectronic device comprising a matrix-array of diodes, each diode comprising: a semiconductor stack formed from a first doped segment and from a second doped segment between which segments is located an active region, and having a coefficient of thermal expansion $\alpha_{es}$, the process comprising the following steps:

i) providing a growth substrate having a coefficient of thermal expansion $\alpha_{se}$ lower than $\alpha_{es}$ and comprising a carrier substrate coated with a nucleation layer defining a nucleation surface;

ii) depositing, on the nucleation surface, a dielectric layer made of an electrically insulating material having a coefficient of thermal expansion acme lower than $\alpha_{es}$;

iii) forming, in the dielectric layer, a plurality of through-apertures that open onto the nucleation surface,
   etching the nucleation layer located in the through-apertures so as to free an upper surface of the carrier substrate and to expose a lateral face of the nucleation layer forming a nucleation lateral face
   forming a dielectric region extending through or over the carrier substrate, so that, in step iv) of epitaxial growth, each first doped segment is especially formed from the nucleation lateral face;

iv) producing, by epitaxial growth, in the through-apertures and from the nucleation surface, said semiconductor stacks, so that at least the first doped segments and the active regions are located in the through-apertures.

2. The fabricating process as claimed in claim 1, wherein each through-aperture comprises a single nucleation surface, which extends over one portion of the outline of the through-aperture, and the nucleation lateral face of which extends, in a plane parallel to the plane of the carrier substrate, in a convex or continuously rectilinear manner.

3. The fabricating process as claimed in claim 2, each through-aperture being bounded transversely by at least one lateral border of the dielectric layer, wherein the nucleation lateral face is flush with the lateral border.

4. The fabricating process as claimed in claim 2, wherein each through-aperture comprises a protruding portion of the nucleation layer, the protruding portion extending into the through-aperture on the carrier substrate and not being coated by the dielectric layer.

5. The fabricating process as claimed in claim 4, wherein an upper face of the protruding portion participates in forming the nucleation surface.

6. The fabricating process as claimed in claim 4, comprising a step of depositing a thin dielectric layer so as to cover an upper face of the protruding portion and an upper face of the carrier substrate thus forming the dielectric region, while leaving free the nucleation lateral face.

7. The fabricating process as claimed in claim 1, wherein the dielectric region is formed by oxidation or nitridation of the silicon-based carrier substrate, or by depositing a thin dielectric layer.

8. The fabricating process as claimed in claim 1, wherein, in the epitaxial growth step, empty spaces are formed between the semiconductor stacks and the dielectric region, and wherein step iv) of epitaxial growth is followed by a step of removing the growth substrate and a portion of the semiconductor stacks containing said empty spaces.

9. The fabricating process as claimed in claim 1, wherein the dielectric layer has a thickness $e_{mc}$, and each semiconductor stack has a thickness $e_{es}$ smaller than $e_{mc}$, and wherein step iv) of epitaxial growth is followed by a step of producing second electrodes resting on and in electrical contact with the second doped segments, this step comprising the following sub-steps:
   depositing a conductive layer of a thickness at least equal to the difference between $e_{mc}$ and $e_{es}$, made of at least one electrically conductive material, so as to cover the semiconductor stacks and an upper face of the dielectric layer, planarizing the conductive layer, with the upper face of the dielectric layer employed as etch-stop, so as thus to form a plurality of second electrodes that make contact with the second doped segments and that are each surrounded by the dielectric layer, the upper faced of the dielectric layer and an upper face of the second electrodes then forming a continuous and substantially planar upper surface of an optoelectronic structure.

10. The fabricating process as claimed in claim 9, the thickness $e_{es}$ being smaller than $e_{mc}$, wherein step iv) is followed by a step of planarizing the dielectric layer, with an upper face of the semiconductor stacks employed as etch-stop, an upper face of the dielectric layer and the upper face of the semiconductor stacks then forming a continuous and substantially planar upper surface of an optoelectronic structure.

11. The fabricating process as claimed in claim 9, comprising a step of hybridizing the optoelectronic structure, via its upper surface, with a control chip suitable for applying a potential difference to the diodes.

12. The fabricating process as claimed in claim 11, wherein the optoelectronic structure and the control chip are hybridized by direct bonding.

13. The fabricating process as claimed in claim 1, each second doped segment comprising a first portion and an overdoped second portion, the first portion being located between the overdoped second portion and the active region, and the overdoped second portion having a doping level higher than that of the first portion and a p-type conductivity type.

14. The fabricating process as claimed in claim 1, wherein, following step iii), each through-aperture comprises a first cavity that opens onto the nucleation surface, and a second cavity-PO that opens onto an upper face of the dielectric layer and that communicates with the first cavity, the dielectric layer comprising a portion extending over the growth substrate and partially bounding the second cavity, the second cavity being laterally offset with respect to the first cavity so that, following step iv), the active region is not located plumb with the nucleation surface.

* * * * *